United States Patent
Sato et al.

(10) Patent No.: US 6,956,211 B2
(45) Date of Patent: Oct. 18, 2005

(54) CHARGED PARTICLE BEAM APPARATUS AND CHARGED PARTICLE BEAM IRRADIATION METHOD

(75) Inventors: Mitsugu Sato, Hitachinaka (JP); Hideo Todokoro, Hinode (JP); Yoichi Ose, Mito (JP); Makoto Ezumi, Mito (JP); Noriaki Arai, Hitachinaka (JP); Takashi Doi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/656,166

(22) Filed: Sep. 8, 2003

(65) Prior Publication Data

US 2004/0119022 A1 Jun. 24, 2004

(30) Foreign Application Priority Data

Sep. 11, 2002 (JP) .................................... 2002-265842
Aug. 28, 2003 (JP) .................................... 2003-305267

(51) Int. Cl.$^7$ ............................................. H01J 29/70
(52) U.S. Cl. .................. 250/310; 250/309; 250/396 R; 250/396 ML
(58) Field of Search ................................. 250/310, 311, 250/307, 309, 396 ML; 315/412, 382, 15

(56) References Cited

U.S. PATENT DOCUMENTS

| | | | | |
|---|---|---|---|---|
| 4,393,310 A | * | 7/1983 | Hahn ........................... | 250/398 |
| 4,618,766 A | * | 10/1986 | van der Mast et al. ..... | 250/311 |
| 4,983,832 A | * | 1/1991 | Sato ............................ | 250/310 |
| 5,221,844 A | * | 6/1993 | van der Mast et al. ..... | 250/398 |
| 5,373,158 A | * | 12/1994 | Murakoshi et al. .......... | 250/311 |
| 5,512,747 A | * | 4/1996 | Maeda ........................ | 250/310 |
| 5,627,373 A | * | 5/1997 | Keese ......................... | 250/310 |
| 6,538,249 B1 | * | 3/2003 | Takane et al. ............... | 250/310 |
| 6,586,753 B2 | * | 7/2003 | Wada ........................ | 250/491.1 |
| 6,653,632 B2 | * | 11/2003 | Kazumori .................... | 250/310 |
| 6,677,585 B2 | * | 1/2004 | Nomura ...................... | 250/310 |
| 6,740,877 B2 | * | 5/2004 | Sawahata et al. ........... | 250/310 |

FOREIGN PATENT DOCUMENTS

| | | |
|---|---|---|
| EP | 1 235 251 A1 | 8/2002 |
| JP | 55-48610 | 9/1953 |
| JP | 02-033843 | 2/1990 |
| JP | 2000-348658 | 12/2000 |
| JP | 2001-015055 | 1/2001 |
| WO | WO 01/33603 A1 | 5/2001 |

* cited by examiner

*Primary Examiner*—Nikita Wells
*Assistant Examiner*—Johnnie L Smith, II
(74) *Attorney, Agent, or Firm*—Dickstein Shapiro Morin & Oshinsky LLP

(57) ABSTRACT

A charged particle beam apparatus produces little reduction in resolution when the beam is inclined with respect to a sample. The trajectory of a primary beam 4 is deflected by a deflector or changed by a movable aperture such that the beam is incident on a plurality of lenses 6 and 7 off the axes thereof. A means is provided to control the off-axis trajectory of the beam such that an aberration produced by the objective lens 7 when the beam is inclined can be canceled by an aberration produced by the other lens 6.

14 Claims, 20 Drawing Sheets

CHARGED PARTICLE BEAM APPARATUS AND CHARGED PARTICLE BEAM IRRADIATION METHOD

BACKGROUND OF THE INVENTION

1. Technical Field

The present invention relates to a charged-particle beam apparatus employing a charged particle beam such as an electron beam or ion beam. In particular, the invention relates to a charged particle beam apparatus suitable for obtaining high-resolution images with a minimum loss of resolution in cases where the charged particle beam is inclined with respect to a sample.

2. Background Art

In charged particle beam apparatuses such as those represented by the scanning electron microscope, a sample is scanned with a narrowly focused beam of charged particles in order to obtain desired information from the sample (such as a sample image). In such charged particle beam apparatuses, higher resolution is continuously becoming possible in recent years, and there is a need to obtain inclined images of a sample by inclining the charged particle beam with respect to the sample. An inclined sample image can be generally obtained by tilting the sample stage. However, it is more practical to tilt the charged particle beam relative to the sample than to mechanically tilt the sample stage, from the viewpoint of preventing a field of view error at higher magnification ratios, or increasing the rate at which inclined sample images are obtained. Hence the need to tilt the charged particle beam.

JP Utility Model Publication (Kokai) No. 55-48610 U (1980) and JP Patent Publication (Kokai) No. 2-33843 A (1990) disclose techniques for inclining a charged particle beam while maintaining the high resolution condition of the system. These techniques cause a charged particle beam to be incident on an objective lens off the axis thereof, and utilize the focusing effect (turning-back effect) of the objective lens. JP Patent Publication (Kokai) No. 2000-348658 A discloses a technique employing deflecting means in two stages for deflecting a charged particle beam in opposite directions in the focusing magnetic field of an objective lens. The technique corrects an off-axis chromatic aberration that is produced when the charged particle beam is tilted off the axis of the objective lens. JP Patent Publication (Kokai) No. 2001-15055 A discloses that deflecting means for passing the charged particle beam off the axis of an objective lens is disposed closer to an electron source than the objective lens. Chromatic aberrations (off-axis chromatic aberrations) produced off the axis of the objective lens are corrected by a Wiener filter disposed closer to the electron source than the objective lens, thus reducing the deterioration in resolution when the charged particle beam is inclined. Further, WO 01/33603 discloses a technique whereby a Wiener filter for generating a perpendicular electromagnetic field in arbitrarily chosen two-dimensional directions perpendicular to the optical axis is disposed on the optical axis closer to an electron source than an objective lens in order to correct for off-axis chromatic aberrations in arbitrary directions.

Patent Document 1: JP Utility Model Publication (Kokai) No. 55-48610 U (1980)

Patent Document 2: JP Patent Publication (Kokai) No. 2-33843 A (1990)

Patent Document 3: JP Patent Publication (Kokai) No. 2000-348658 A

Patent Document 4: JP Patent Publication (Kokai) No. 2001-15055 A

Patent Document 5: WO 01/33603

The method disclosed in JP Kokai 2000-348658 A, in which the charged particle beam is deflected in two stages in the magnetic field of the objective lens, has the problem that high resolution cannot be obtained when adapted to those systems in which the objective lens magnetic field is caused to leak towards the sample in order to obtain high resolution. Such systems are becoming increasingly common in recent years. The aforementioned problem is due to the fact that the distance between the magnetic poles of the objective lens and the sample has to be increased so that the two-stage deflection means can be disposed therebetween. This problem is addressed by JP Kokai 2000-348658, in which four magnetic poles for the objective lens are provided, and in which the combination of the magnetic poles can be switched depending on whether the purpose is high-resolution observation or the inclination of the charged-particle beam. In this method, however, as the number of magnetic poles is increased, axial misalignment among magnetic poles or other various problems (such as magnification error, axial misalignment, variations in scan conditions, etc.) that could be encountered when switching is performed must be solved before the method can be used in actual applications.

Generally, when a charged particle beam is tilted using the off-axis properties of an objective lens, not only an off-axis chromatic aberration but also a coma aberration are produced. While the off-axis chromatic aberration is dominant at low acceleration voltages, the coma aberration is more of a concern at relatively high acceleration voltages. Therefore, eliminating the coma aberration is important when the acceleration voltage is relatively high. Even at lower acceleration voltages, the coma aberration becomes large if the angle of inclination of the charged particle beam is increased, making it impossible to obtain high resolution even if the off-axis chromatic aberration is corrected. Thus, in order to obtain high-resolution images in cases where the charged particle beam is inclined at large angles, the off-axis chromatic aberration and the coma aberration must both be corrected at the same time. However, there is no consideration given in JP Kokai 2000-348658 to this issue, resulting in the problem of lowered resolution at high inclination angles.

In the technique disclosed in JP Kokai 2001-15055 A, the off-axis chromatic aberration produced as a charged particle beam is incident on an objective lens off the axis thereof is corrected using a Wiener filter. However, a Wiener filter is not capable of removing the coma aberration, resulting in a decrease in resolution in cases where the charged particle beam is inclined at large angles or when the charged particle beam is inclined at relatively high acceleration voltages.

Now referring to FIG. 2, the aberrations produced when the charged particle beam is inclined towards a sample using the turning-back effect of an objective lens will be described. A beam 4 is deflected by a beam inclination angle control coil 51 at the object point of an objective lens 7 such that the beam is incident on the objective lens 7 off its axis. As a result, the beam 4 is inclined towards a sample 10 due to the focusing effect of the objective lens 7. In this case, as the object point as seen from the objective lens 7 is not shifted, the field of view does not move even if the beam is inclined. By correcting the shift in the field of view when the beam is inclined, the beam in principle satisfies the deflection condition depicted in FIG. 2.

The aberration of the objective lens that is produced when the object point is on the optical axis consists of spherical aberration and on-axis chromatic aberration. The aberration ($\Delta w_i$) produced by the objective lens can be expressed by a polynomial (1) shown below as a function of a trajectory inclination ($w'_i$) on the sample. The trajectory curve is expressed as a differential equation of a trajectory function w ($w=x+j\cdot y$, where j is the imaginary unit of a complex number) with respect to an optical axis z. A differential equation with respect to z will be herein indicated by a prime ("'").

$$\Delta w_i = C_{si} \cdot w'_i \cdot w'_i \cdot \overline{w}'_i + C_{ci} \cdot \epsilon_i \cdot w'_i \quad (1)$$

wherein $$\varepsilon_i = \frac{\Delta V}{V_i} \quad (2)$$

$\Delta w_i$: Aberration on the image surface
$w'_i$: Inclination of trajectory towards the image surface $\overline{w}'_i$: Complex conjugate of $w'_i$
$C_{si}$: Spherical aberration coefficient on the image surface
$C_{ci}$: On-axis chromatic aberration coefficient on the image surface
$\Delta V$: Variations in beam energy
$V_i$: Beam energy on the image surface In the case where the beam is inclined by the turning-back effect of the objective lens, the trajectory curve ($w'_i$) towards the sample can be expressed as the sum of a trajectory curve ($w'_t$) corresponding to the beam inclination angle and a trajectory curve ($w'_f$) associated with the beam opening angle as follows:

$$w'_i = w'_t + w'_f \quad (3)$$

$$\overline{w}'_i \overline{w}'_t + \overline{w}'_f \quad (4)$$

FIG. 3 shows the condition of the beam in a trajectory curve coordinate system ($w'_i$-coordinate system) on the sample. The horizontal axis in FIG. 3 indicates the gradient of the trajectory in the X-direction on the image surface, while the vertical axis indicates the gradient of the trajectory in the Y-direction. As the gradient of the trajectory is indicated by a differential equation with respect to z, the description has primes, as mentioned above. The circular figure (beam region) in FIG. 3 indicates the region of a set of trajectories of the primary beam having various gradients produced by the focusing effect of the lens. In FIG. 3, the center of the focusing trajectories of the beam corresponds to the beam gradient ($w'_t$), so that the circular figure is displaced from the center of the coordinate system (xi', yi') in accordance with the beam gradient. The aberration when the beam is inclined can be obtained by substituting equations (3) and (4) into equation (1) as follows:

$$\Delta w_i = C_{si} \cdot (w'_t + w'_f) \cdot (w'_t + w'_f) \cdot (\overline{w}'_t + \overline{w}'_f) + C_{ci} \cdot \varepsilon_i \cdot (w'_t + w'_f) \quad (5)$$

Equation (5) can be expanded to give equation (6), in which it will be seen that Seidel aberrations (spherical aberration, coma aberration, astigmatism, field curvature aberration, and distortion) and on-axis and off-axis chromatic aberrations are produced by the beam inclination (whereby the trajectory is displaced off axis) in the system in which originally there was only an on-axis aberration.

$$\Delta w_i = C_{si} \cdot (w'_f \cdot w'_f \cdot \overline{w}'_f +$$

$$\overline{w}'_t w'_f \cdot w'_f + 2 w'_t w'_f \cdot \overline{w}'_f +$$

$$\cdot 2 w'_t \overline{w}'_t w'_f + w'_t w'_t$$

$$\overline{w}'_f + w'_t w'_t \overline{w}'_t) +$$

$$C_{ci} \cdot \varepsilon_i \cdot (w'_t + w'_f) \quad (6)$$

These aberrations are listed below.

| | |
|---|---|
| $C_{si} \cdot w'_f \cdot w'_f \cdot \overline{w}'_f$ | (7): Spherical aberration |
| $C_{si} \cdot (\overline{w}'_t \cdot w'_f \cdot w'_f + 2 w'_t \cdot w'_f \cdot \overline{w}'_f)$ | (8): Coma aberration |
| $C_{si} \cdot (w'_t \cdot w'_t \cdot \overline{w}'_f + 2 w'_t \overline{w}'_t w'_f)$ | (9): Astigmatism + field curvature aberration |
| $C_{si} \cdot w'_t \cdot w'_t \cdot \overline{w}'_t$ | (10): Distortion |
| $C_{ci} \cdot \varepsilon_i \cdot w'_t$ | (11): Off-axis chromatic aberration |
| $C_{ci} \cdot \varepsilon_i \cdot w'_f$ | (12): On-axis chromatic distortion |

Of the items in the above list, terms containing $w'_t$ are aberrations produced by the inclination of the beam, which are coma aberration, astigmatism, field curvature aberration, distortion, and off-axis chromatic aberration. However, only those aberrations that contain the beam focusing angle ($w'_f$) and the function $\epsilon_i$ of the energy width $\Delta V$ (namely, coma aberration, astigmatism, field curvature aberration, and off-axis chromatic aberration) cause a deterioration in resolution when the beam is inclined.

Of those aberrations that cause deterioration in resolution when the beam is inclined, astigmatism can be easily corrected by means of a conventional astigmatism correction coil. The field curvature aberration, which is a focusing error due to beam inclination, can be eliminated by correcting the focusing condition (objective lens current). Further, the distortion, which is due to the displacement of the irradiated position caused by the beam inclination, can be eliminated by correcting the irradiated position in accordance with the beam inclination. Thus, the remaining aberrations to be considered are the off-axis chromatic aberration and the coma aberration, which both increase in proportion to the angle of beam inclination ($w'_t$).

SUMMARY OF THE INVENTION

The object of the invention is to provide a charged particle beam apparatus capable of eliminating the above-described off-axis chromatic aberration and coma aberration in a practical and easy manner. This will allow the beam to be inclined at large angles while preventing the lowering of resolution.

To achieve this object of the invention, the apparatus according to the invention includes at least two stages of focusing lenses including an objective lens, and deflection means for causing the beam to be incident on each of the lenses off the axis thereof. In accordance with the invention, the off-axis aberrations (off-axis chromatic aberration and/or coma aberration) produced by the lenses are made to cancel each other out, so that the sum of the off-axis aberrations produced by the lenses is zero or close to zero. The apparatus further includes means for controlling astigmatism in accordance with the beam inclination angle. This allows the astigmatism, which varies depending on the beam inclination angle, to be corrected. Preferably, the focal length of the objective lens may be controlled in accordance with the beam inclination angle. Further preferably, an irradiated position error may be corrected in accordance with the beam inclination angle, Preferably, an aperture mechanism may be provided in place of the deflection means so that the passage of the beam can be limited. This causes the beam to be incident on the lenses effectively off the axes thereof.

In accordance with the invention, inclined observation images can be obtained with high resolution without the influences of off-axis chromatic aberration, coma aberration, or astigmatism, even when the beam is inclined by the focusing effect of the objective lens.

DESCRIPTION OF THE INVENTION

Figure 1:
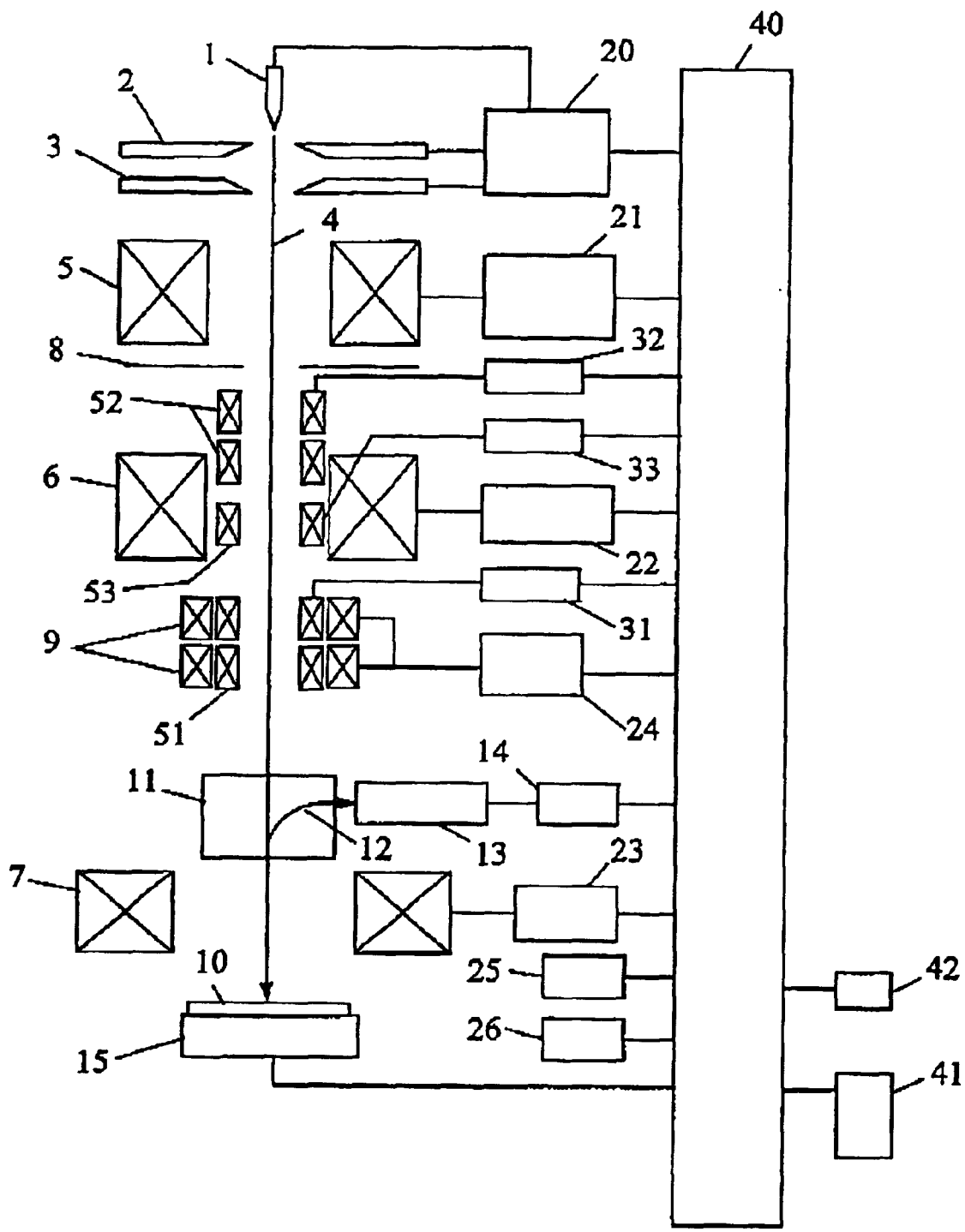
FIG. 1 shows an example of the scanning electron microscope according to the present invention.
Figure 2:
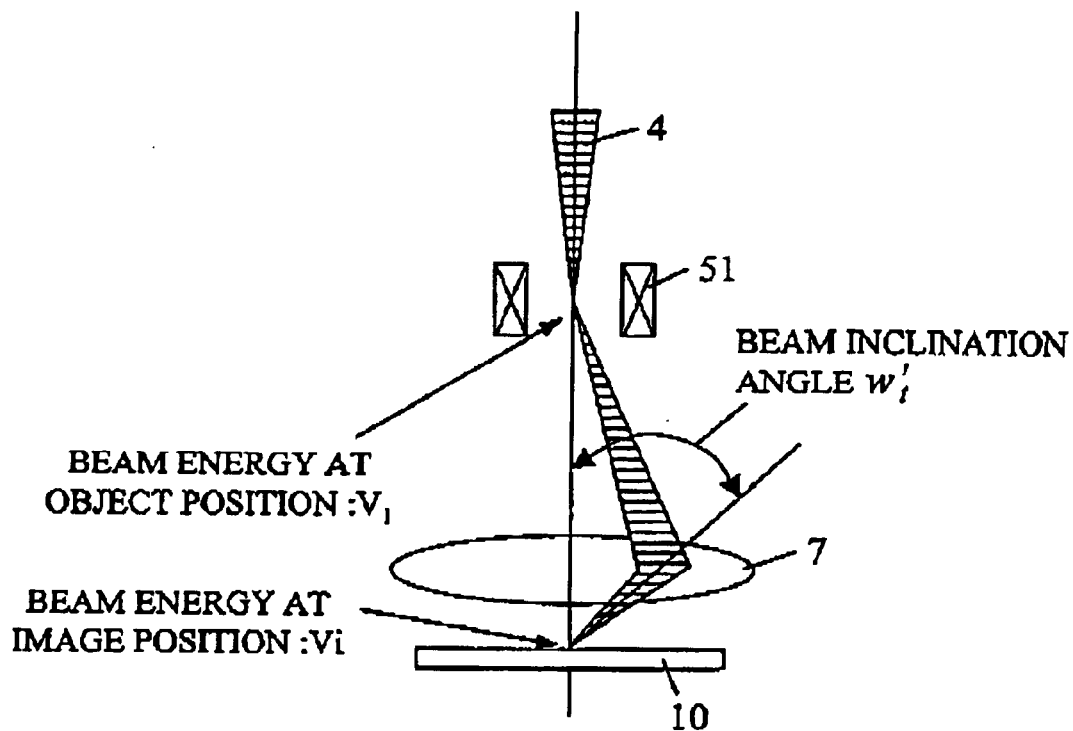
FIG. 2 shows the principle of inclining the beam using the focusing effect of an objective lens.
Figure 3:
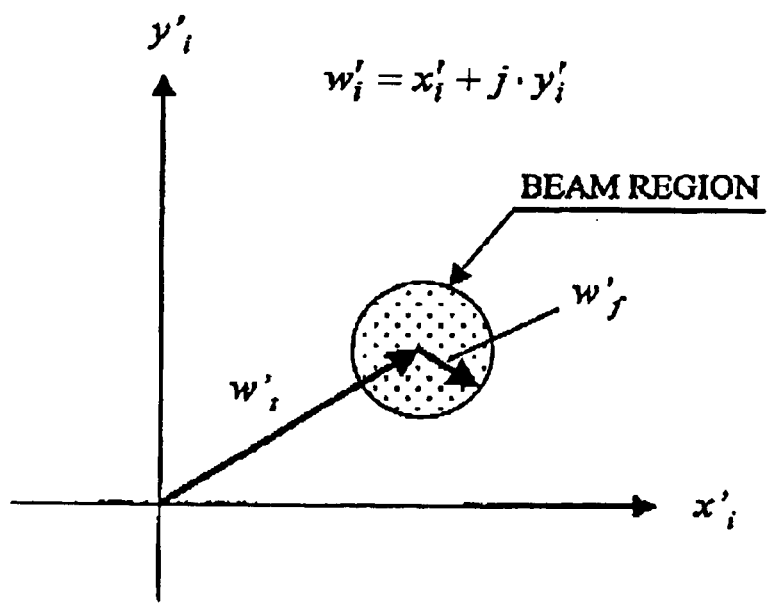
FIG. 3 shows the distribution of trajectory gradient when the beam is inclined.

The invention will be hereafter described by referring to the drawings, in which parts with similar functions are designated with similar numerals to avoid redundant explanations.

FIG. 1 shows a diagram of a scanning electron microscope as an example of the invention. A voltage is applied across a cathode 1 and a first anode 2 by a high-voltage control power supply 20 controlled by a computer 40. A primary electron beam 4 is drawn from the cathode 1 with a certain emission current. An acceleration voltage is applied across the cathode 1 and a second anode 3 by the high-voltage control power supply 20 under the control of the computer 40. The primary electron beam 4 emitted by the cathode 1 is accelerated by the acceleration voltage before arriving at a lens system in a subsequent stage. The primary electron beam 4 is then focused by a focusing lens 5 controlled by a lens control power supply 21. After unwanted regions are eliminated from the primary electron beam with an aperture plate 8, the beam is focused on a sample 10 as a minute spot by a focusing lens 6 controlled by a lens control power supply 22 and by an objective lens 7 controlled by an objective lens control power supply 23. The objective lens 7 may be of any desired type, such as an in-lens type, out-lens type, or snorkel (semi in-lens) type. Alternatively, a retarding type may be employed, whereby the primary electron beam is decelerated by applying a negative voltage to the sample. Preferably, each of the lenses may be formed by an electrostatic lens comprised of a plurality of electrodes.

The primary electron beam 4 is made to scan the sample 10 two dimensionally by a scanning coil 9 controlled by a scanning coil control power supply 24. A secondary signal 12 such as secondary electrons emitted by the sample 10 as it is irradiated with the primary electron beam proceeds above the objective lens 7 where the secondary signal is separated from primary electrons by a perpendicular electromagnetic field generator 11 for secondary signal separation. The secondary signal is then detected by a secondary signal detector 13. The signal detected by the secondary signal detector 13 is amplified by a signal amplifier 14, transferred to an image memory 25, and is then displayed on an image display device 26 as a sample image.

Deflection coils St are disposed in two stages at the same location as the scanning coil 9. The position of the primary electron beam 4 incident on the objective lens can be controlled two dimensionally by the deflection coils 51 under the control of an inclination control power supply 31 such that the object point of the objective lens is the point of deflection. Thus, the beam can be inclined with respect to the optical axis of the objective lens. An astigmatism correction coil 53 is disposed near the focusing lens 6 and is controlled by an astigmatism correction power supply 33 in accordance with the degree of beam inclination. Other deflection coils 52 are disposed in two stages between the focusing lens 6 and the aperture plate 8. The position of the primary electron beam 4 incident on the focusing lens 6 can be controlled two dimensionally by an aberration control power supply 32 such that the object point of the focusing lens 6 is the point of deflection. In addition to the primary electron beam position control signal for making the object point of the objective lens to be the point of deflection, a control signal can be caused to flow into the deflection coils 51 for two dimensionally controlling the position of irradiation of the sample by the primary electron beam. Thus, an irradiated position error can be corrected in accordance with the beam inclination conditions.

The sample 10 can be transported by the sample stage 15 in at least two directions (X and Y directions) in a plane perpendicular to the primary electron beam. Various instructions can be entered via an input device 42 concerning, for example, image acquisition conditions (such as scan speed and acceleration voltage), beam inclination conditions (such as the direction and angle of inclination), the output of images, and the storage of images in a storage device 41.
(Embodiment 1)

An embodiment of the present invention for correcting an off-axis chromatic aberration produced when the beam is inclined in the scanning electron microscope shown in FIG. 1 will be described by referring to FIG. 4, which shows a principal portion of the microscope.

The primary beam 4 is deflected by the deflection coils 52 (to be hereafter referred to as aberration control coils) such that the object point of the focusing lens 6 is the point of deflection. As a result, an aberration with the same property as that obtained when the beam is inclined can be produced by the focusing lens 6. When the beam energy at the image point (crossover point) of the focusing lens 6 is $V_1$, the parameter of the energy width corresponding to equation (2) is expressed by $$\varepsilon_1 = \frac{\Delta V}{V_1} \quad (13)$$

When the angular magnification of the objective lens is $M_a$, the focusing angle ($w'_{f1}$) of the beam at the image point of the aberration correction lens is given by $$w'_{f1} = M_a^{-1} \cdot w'_f \quad (14)$$

Further, when the ratio between a beam inclination angle (for aberration correction) $w'_{t1}$ by the focusing lens 6 and a beam inclination angle $w'_1$ by the objective lens 7 is expressed using k as follows, $$w'_{t1} = k \cdot w'_t \quad (15)$$

the amount $\Delta w_1$ of aberration produced by the focusing lens 6 that appears in the eventual focusing point is given by $$\Delta_t = M \cdot C_{si} \cdot \{ M_a^{-3} w'_f \overline{w'_f}$$

$$\overline{w'_f} + M_a^{-2} k (\overline{w'_t} w'$$

$$\overline{w'_f} + 2 w'_t w'_f \overline{w'_f}) +$$

$$M_a^{-1} k^2)(2 w'_t \overline{w'_t} w'_f$$

$$+ w'_t w'_t \overline{w'_f}) + w'_t w'_t$$

$$\overline{w'_t} \} + M \cdot k C_{s1} \varepsilon_1 \cdot w'_1 + M \cdot M_a$$

$$-1 \cdot C_{c1} \cdot \varepsilon_1 w'_f \quad (16)$$

where M is the optical magnification of the objective lens, $C_{s1}$ is the spherical aberration coefficient of the focusing lens 6, and $C_{c1}$ is the on-axis chromatic aberration coefficient of the focusing lens 6.

Thus, the beam inclination condition (condition k) of the focusing lens 6 for canceling the off-axis chromatic aberration produced by the objective lens 7 is given by equation (18) from equation (17).

$$(C_{ci} \cdot \varepsilon_i + M \cdot k \cdot C_{c1} \cdot \varepsilon_1) \cdot w'_t = 0 \quad (17)$$

$$k = -\frac{C_{ci} \cdot \varepsilon_i}{M \cdot C_{c1} \cdot \varepsilon_1} \quad (18)$$

Figure 4:
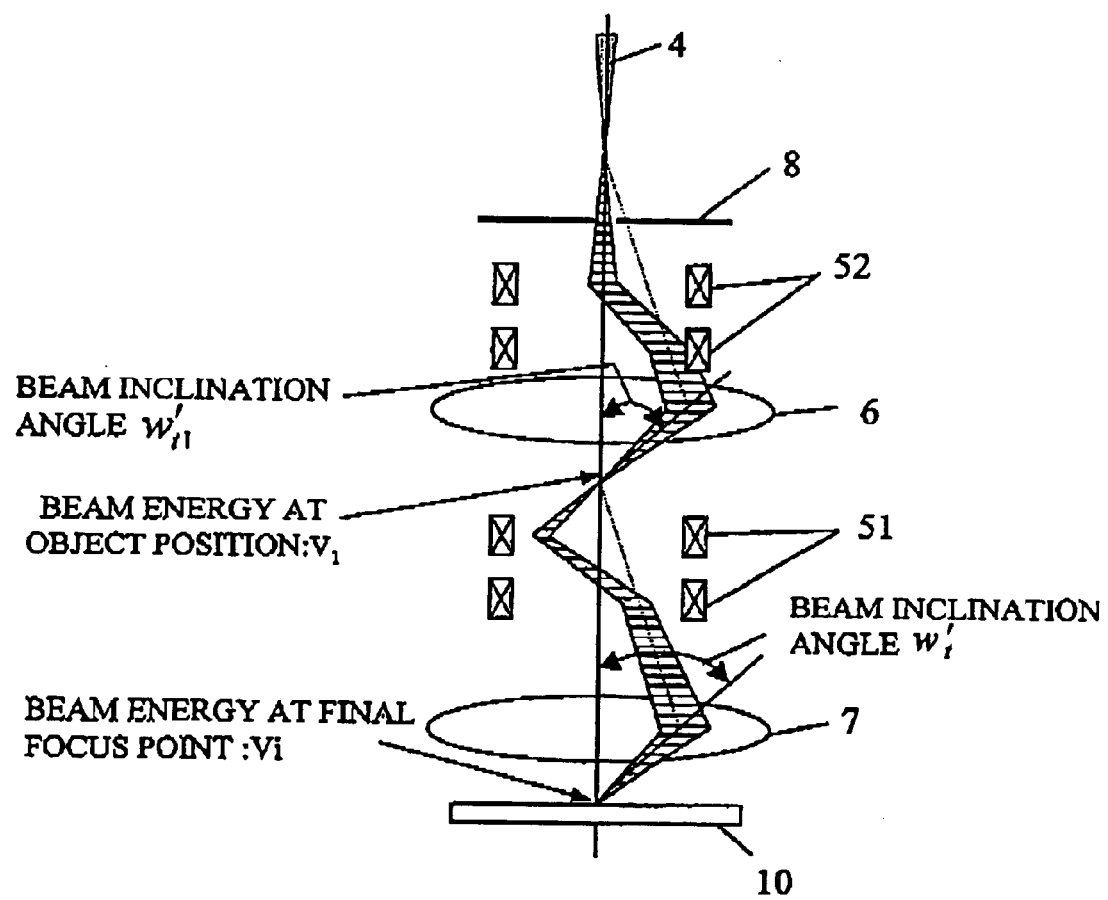
FIG. 4 shows the principle of correcting aberrations when the beam is inclined.

Although the right-side member of equation (18) has a negative sign, the value of k becomes positive because the optical magnification value M is a negative value in the configuration of FIG. 4. For example, when the value of equation (18) is 0.2, the beam should only be inclined by the focusing lens 6 by an angle 0.2 times the angle of inclination of the beam by the objective lens 7. As the angle of inclination of the beam by the objective lens 7 is proportional to the current flowing in the deflection coils 51 (to be hereafter referred to as a beam inclination angle control coil), it is possible to preset the relationship between the current in the beam inclination angle control coil 51 and the corresponding angle of inclination of the beam by the objective lens 7 by registering the relationship in the storage device 41. Further, as the angle of inclination of the beam by the focusing lens 6 is proportional to the current in the aberration control coil 52, it is possible to preset the relationship between the current in the aberration control coil 52 and the corresponding angle of inclination of the beam by the focusing lens 6 by registering the relationship in the storage device 41, for example. Thus, based on the preset conditions and the value of equation (18), the beam inclination angle control power supply 31 and the aberration control power supply 32 can be controlled by the computer 40 such that the proportional relationship in current between the beam inclination angle control coil 51 and the aberration control coil 52 satisfies the condition k in equation (18). If the sign of k in equation (18) becomes negative, this means that the focusing lens 6 inclines the beam in the opposite direction to the direction of inclination of the beam by the objective lens. In such a case, the polarity of the current in the aberration correction coil 52 is opposite to that in the beam inclination angle control coil 51.

The condition for canceling the coma aberration is obtained by equation (20) from equation (19).

$$C_{si} + M \cdot M_a^{-2} \cdot k \cdot C_{s1} = 0 \quad (19)$$

$$k = -\frac{M_a^2 \cdot C_{si}}{M \cdot C_{s1}} \quad (20)$$

In this case, the value of k is generally different from that in equation (18), so that, if the value of k in equation (20) is selected, equation (18) would not be satisfied, resulting in the development of a chromatic aberration as the beam is inclined. This is due to the fact that, because of the different shapes of the objective and focusing lenses, the ratio in magnitude between the chromatic aberration and the coma aberration produced when the beam is inclined by the objective lens 7 does not correspond to that between the chromatic aberration and the coma aberration produced when the beam is inclined by the focusing lens 6.

In the present embodiment, when the off-axis chromatic aberration is dominant at low acceleration voltages below 5 kV, for example, the beam inclination angle control coil 51 and the aberration control coil 52 are controlled in tandem such that the condition of equation (18) can be satisfied. On the other hand, under conditions where the acceleration voltage exceeds 5 kV, the coma aberration becomes dominant. Thus, in these conditions, the beam inclination angle control coil 51 and the aberration control coil 52 are controlled in association with one another such that the condition of equation (20) is satisfied. The boundary acceleration voltage between the chromatic aberration dominance and the coma aberration dominance is not limited to 5 kV, as the voltage depends on the spherical aberration coefficient and the on-axis chromatic aberration coefficient of the objective lens, as well as the energy width of the primary electron beam. The optimum control condition of the aberration control coil 52 is proportional to the beam inclination angle. Accordingly, in the present embodiment, appropriate conditions for specific beam inclination angles are preset, and the beam inclination angle control coil 51 and the aberration control coil 52 are controlled by determining the association condition therebetween through calculating the control condition for a given beam inclination angle.

(Embodiment 2)

In cases where the off-axis chromatic aberration and the coma aberration have the same degree of influence when the beam is inclined, or when the beam inclination angle is large, such as 5° or more, for example, it is necessary to correct the off-axis chromatic aberration and the coma aberration at the same time.

In order to correct the off-axis chromatic aberration and the coma aberration at the same time, equations (18) and (20) must have the same value for k. To satisfy this condition, conditions such as the optical magnification (lateral magnification) of the objective lens must be set. These conditions are given by equation (22), which is derived from a relational expression (21) well known in electronic-optical theories.

$$M \cdot M_a \cdot \sqrt{\frac{V_i}{V_1}} = 1 \qquad (21)$$

$$\frac{C_{c1}}{C_{s1}} = M^2 \cdot \frac{C_{ci}}{C_{si}} \qquad (22)$$

Figure 5:
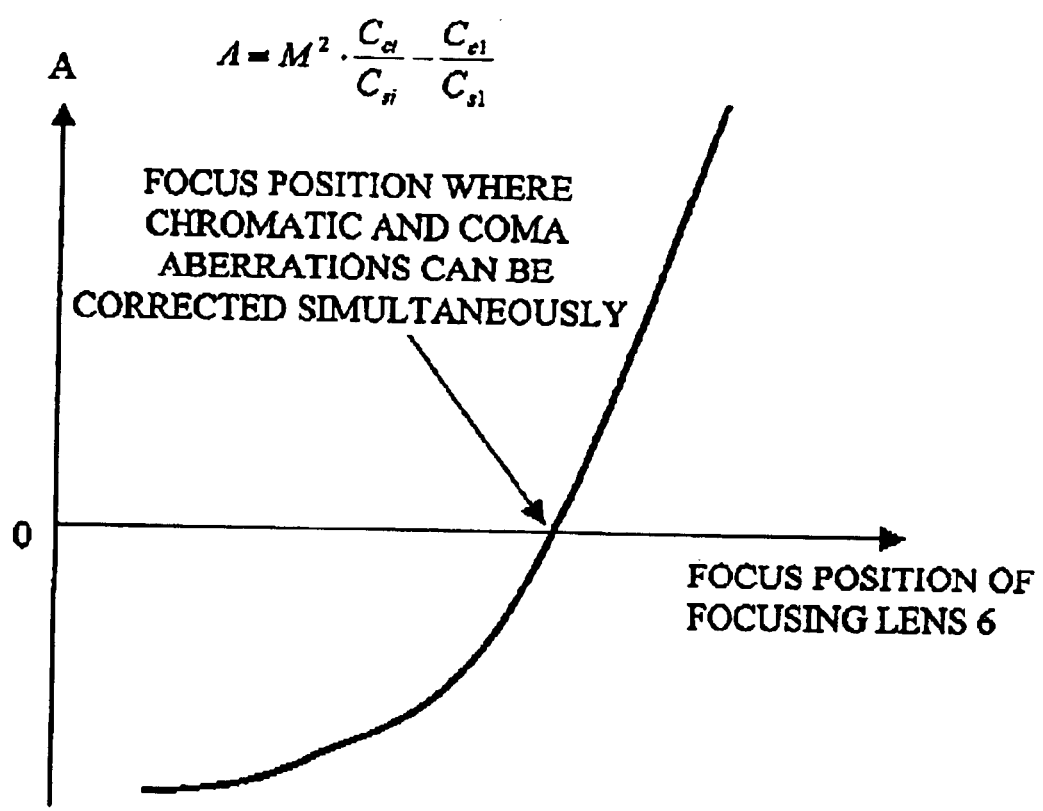
FIG. 5 shows the condition of the focus position of the focusing lens for simultaneously correcting the chromatic aberration and the coma aberration.

Equation (22) can be satisfied by setting the focus position of the focusing lens 6 under certain conditions. Specifically, the value of M increases as the focus position of the focusing lens 6 is shifted towards the objective lens, and the value decreases as the focus position is moved away from the objective lens. Thus, as shown in FIG. 5, in which the vertical axis indicates A ($=M^2(C_{ci}/C_{si})-(C_{c1}/C_{s1})$) and the horizontal axis indicates the focus position of the focusing lens 6, a focus position where A=0 can be found. This focus position is a condition that satisfies equation (22), and that focus position can be determined experimentally or by simulation.

Using the relationship in equation (21), we derive $$k = -\frac{C_{si}}{M^3 \cdot C_{s1}} \frac{V_1}{V_i} \qquad (23)$$

from equation (20), which gives the optimum control condition for the aberration control coil 52.

In the present embodiment, the excitation condition for the focusing lens 6 is set such that the relationship of equation (21) is satisfied, while the beam inclination angle control coil 51 and the aberration control coil 52 are controlled in conjunction with each other such that the relationship of equation (23) is satisfied.

Figure 6:
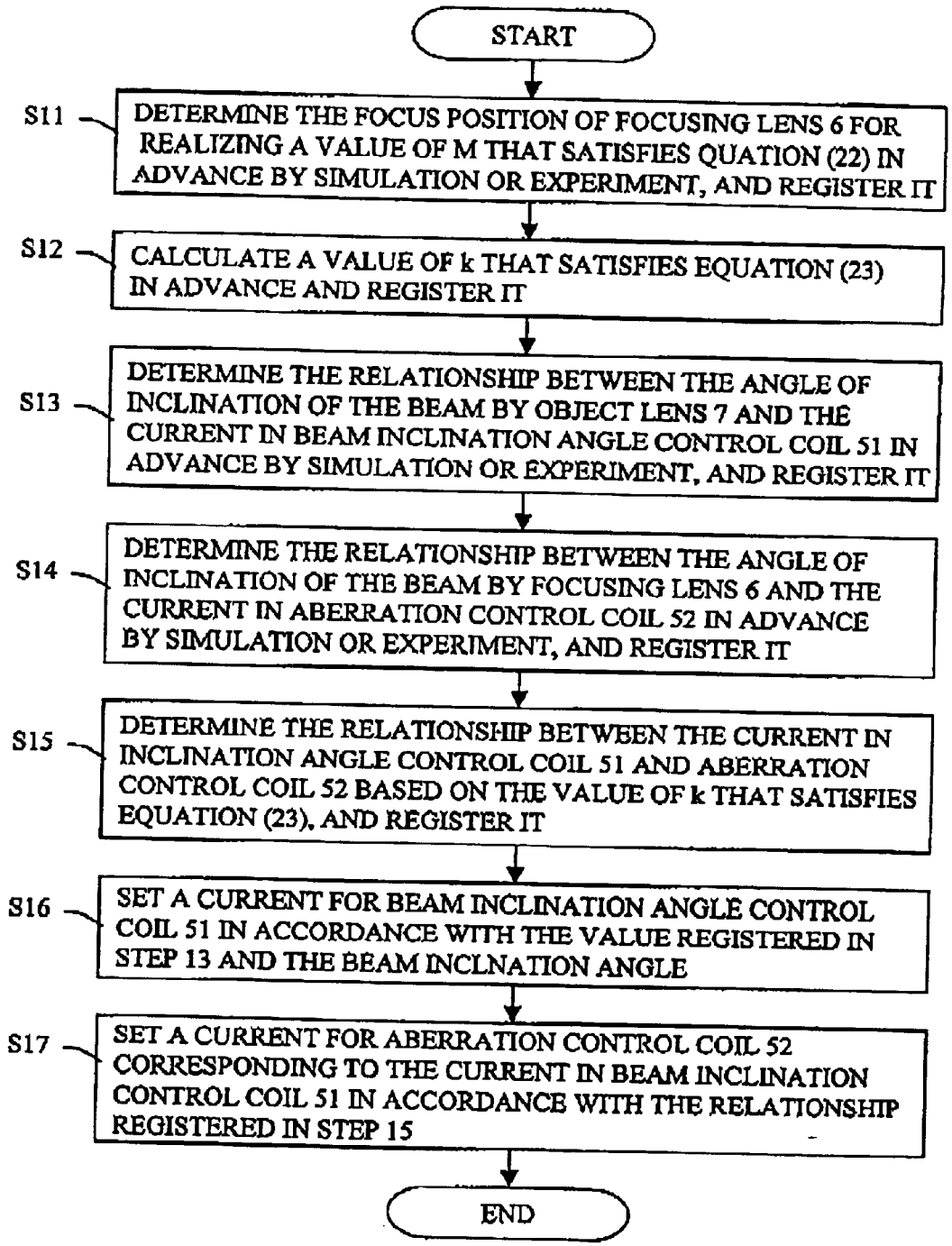
FIG. 6 shows a flowchart of the process of inclining the beam in a manner such that the chromatic aberration and the coma aberration can be corrected simultaneously.

Now referring to a flowchart of FIG. 6, a control flow for simultaneously correcting the chromatic aberration and the coma aberration will be described.

Initially, a focusing position of the focusing lens 6 for realizing a value of M that allows equation (22) to be satisfied is obtained in advance by simulation or experiment, and the obtained value is registered in the storage device 41 (step 11). Then, a value of k that satisfies equation (23) is calculated in advance and registered in the storage device 41 (step 12). Preferably, the value of k may be obtained in advance by experiment or simulation.

A relationship between the angle of inclination of the beam by the objective lens 7 and the current in the beam inclination angle control coil 51 is obtained in advance by experiment or simulation and registered in the storage device 41 (step 13). A relationship between the angle of inclination of the beam by the focusing lens 6 and the current in the aberration control coil 52 is obtained in advance by experiment or simulation and is registered in the storage device 41 (step 14). Then, based on the value of k that satisfies equation (23), a relationship between the current in the beam inclination angle control coil 51 and that in the aberration control coil 52 is obtained and registered in the storage device 41 (step 15).

Then, the computer 40 sets the current for the beam inclination angle control coil 51 based on the relationship registered in step 13 and the beam inclination angle (step 16). The computer 40 further sets the current for the aberration control coil 52 corresponding to the beam inclination angle control coil 51 based on the relationship registered in step 15 (step 17).

(Embodiment 3)

Figure 9:
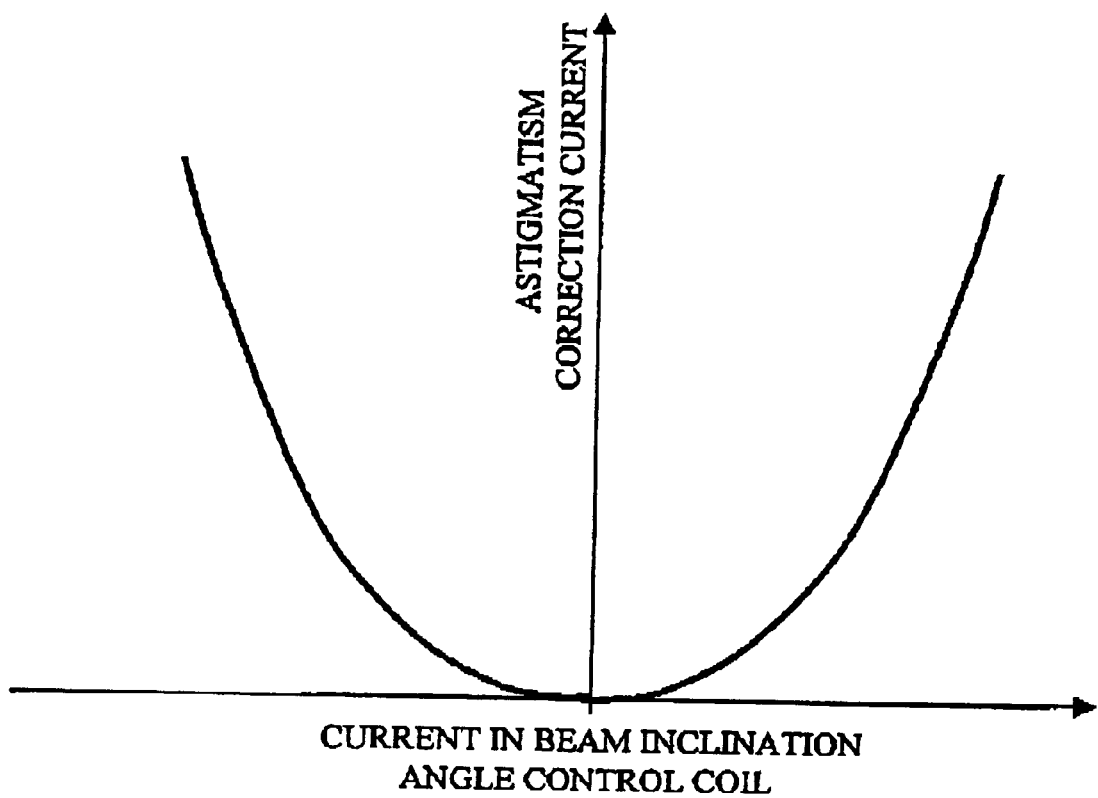
FIG. 9 shows the relationship between the current in a beam inclination angle control coil and the current in an astigmatism correction coil for correcting an astigmatism produced by the inclination of the beam.

In Embodiment 3, the astigmatism correction coil and the objective lens current are further controlled in accordance with the beam inclination. As will be seen from equation (9), the astigmatism produced by the inclination of the beam increases in proportion to the square of the beam inclination angle ($w'_t$). The beam inclination angle ($w'_t$) is proportional to the current in the beam inclination angle control coil 51. Thus, in the present embodiment, the operating conditions of the astigmatism corrector 53 for correcting astigmatism as shown in FIG. 9 are preset by registering them in the storage device 41, for example, with respect to a plurality of predetermined conditions for the current in the beam inclination angle control coil 51. The astigmatism produced by the inclination of the beam is given as the difference between the amount of astigmatism correction (Isx0, Isy0) at zero beam inclination angle (when the current in the beam inclination angle control coil 51 is zero) and the amount of astigmatism correction at a given beam inclination angle. Thus, the astigmatism correction currents for the condition where the current for the beam inclination angle control coil 51 is (0, 0), and for predetermined current conditions (Ix0, Iy0) are preset in the storage device 41 as (Isx0, Isy0) at (Ix, Iy)=(0, 0), (Isx1, Isy1) at (Ix, Iy)=((Ix0, 0), (Isx2, Isy2) at (Ix, Iy)=(0, Iy0), and (Isx3, Isy3) at (Ix, Iy)=(Ix0, Iy0). Based on these preset values, the computer 40 controls the current (Isx, Isy) for the astigmatism correction coil 53 in conjunction with a given current (Ix, Iy) for the beam inclination angle control coil 51 in the following manner:

$$I_{sx} = (I_{sx1} - I_{sx0}) \times \left(\frac{I_x}{I_{x0}}\right)^2 +$$

$$(I_{sx2} - I_{sx0}) \times \left(\frac{I_y}{I_{y0}}\right)^2 + (I_{sx3} - I_{sx1} - I_{sx2} + I_{sx0}) \times \left(\frac{I_x I_y}{I_{x0} I_{y0}}\right)$$

$$I_{sy} = (I_{sy1} - I_{sy0}) \times \left(\frac{I_x}{I_{x0}}\right)^2 +$$

$$(I_{sy2} - I_{sy0}) \times \left(\frac{I_y}{I_{y0}}\right)^2 + (I_{sy3} - I_{sy1} - I_{sy2} + I_{sy0}) \times \left(\frac{I_x I_y}{I_{x0} I_{y0}}\right)$$

By this control, the astigmatism correction coil 53 is set such that astigmatism can be automatically corrected when the beam inclination angle is controlled by setting the current for the beam inclination angle control coil 51. Further, a focusing current (objective lens current) error $\Delta I_{o1}$ that occurs when the current (Ix, Iy) for the beam inclination angle control coil 51 is changed from (0, 0) to (Ix0, 0), and a focusing current error $\Delta I_{o2}$ that occurs when (Ix, Iy) is changed from (0, 0) to (0, Iy0) are registered in the storage device 41. Using these registered values, the computer 40 controls a focusing current correction value $\Delta I_o$ with respect to a given current (Ix, Iy) for the beam inclination angle control coil 51 as follows:

$$\Delta I_o = \Delta I_{o1}\left(\frac{I_x}{I_{x0}}\right)^2 + \Delta I_{o2}\left(\frac{I_y}{I_{y0}}\right)^2$$

By this control, the focusing error can be automatically corrected even when the beam inclination angle is controlled by setting the current for the beam inclination angle control coil 51.

(Embodiment 4)

Figure 7:
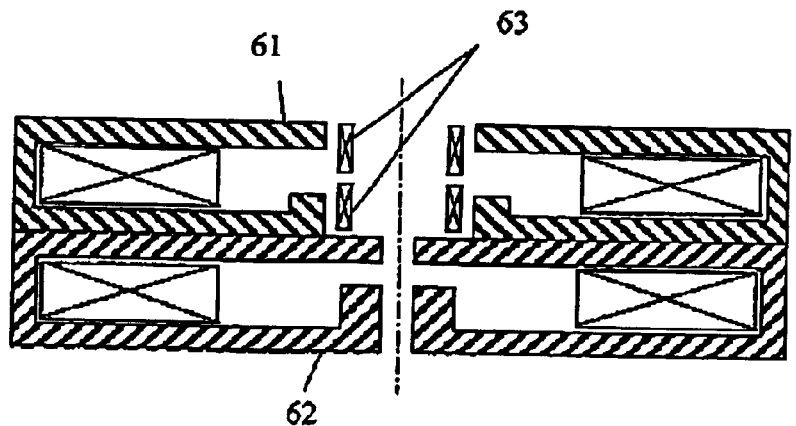
FIG. 7 shows the structure of a focusing lens composed of four magnetic poles.

FIG. 7 shows the fourth embodiment in which the focusing lens 6 is composed of two lenses. In order to produce an aberration that cancels the coma aberration produced by the objective lens due to the beam inclination in the focusing lens, which is disposed closer to the electron source than the objective lens, the spherical aberration in the focusing lens must be increased. This is because, as shown by equation (23), the contribution (aberration correction amount) of the spherical aberration in the focusing lens to the final point of focus decreases in proportion to the cube of the optical magnification (M<1) of the objective lens. Therefore, it is desirable to use a focusing lens with a small magnetic pole opening size and with a small gap, so that a large spherical aberration can be obtained when the beam is inclined. However, a lens with a large spherical aberration is disadvantageous for high-resolution observation purposes. Thus, in the present embodiment, a lens 61 with a small geometric aberration, such as spherical aberration, is used in combination with a lens 62 with a large geometric aberration, so that high resolution applications and the beam inclining function can be realized simultaneously in a compatible manner.

In the present embodiment, the lens 61 (having magnetic poles with a large opening diameter) and the lens 62 (having magnetic poles with little gap with the opening diameter) with a large geometric aberration can be switched depending on purposes. Namely, the high-resolution lens 61 with a small geometric aberration is used for high-resolution observation purposes, while turning off the lens 62 with a large geometric aberration. On the other hand, the lens 62 with a large geometric aberration is used in cases where the beam is inclined, while turning off the high-resolution lens 61. The axial misalignment caused by the switching of the magnetic poles can be solved by providing the aberration control coil 63 with an additional function as an alignment coil for correcting the axial misalignment.

While in the above-described embodiment the aberration produced by the objective lens due to the beam inclination is corrected by another lens, it is also possible to use two or more lenses for correcting the aberration in the objective lens.

Figure 8:
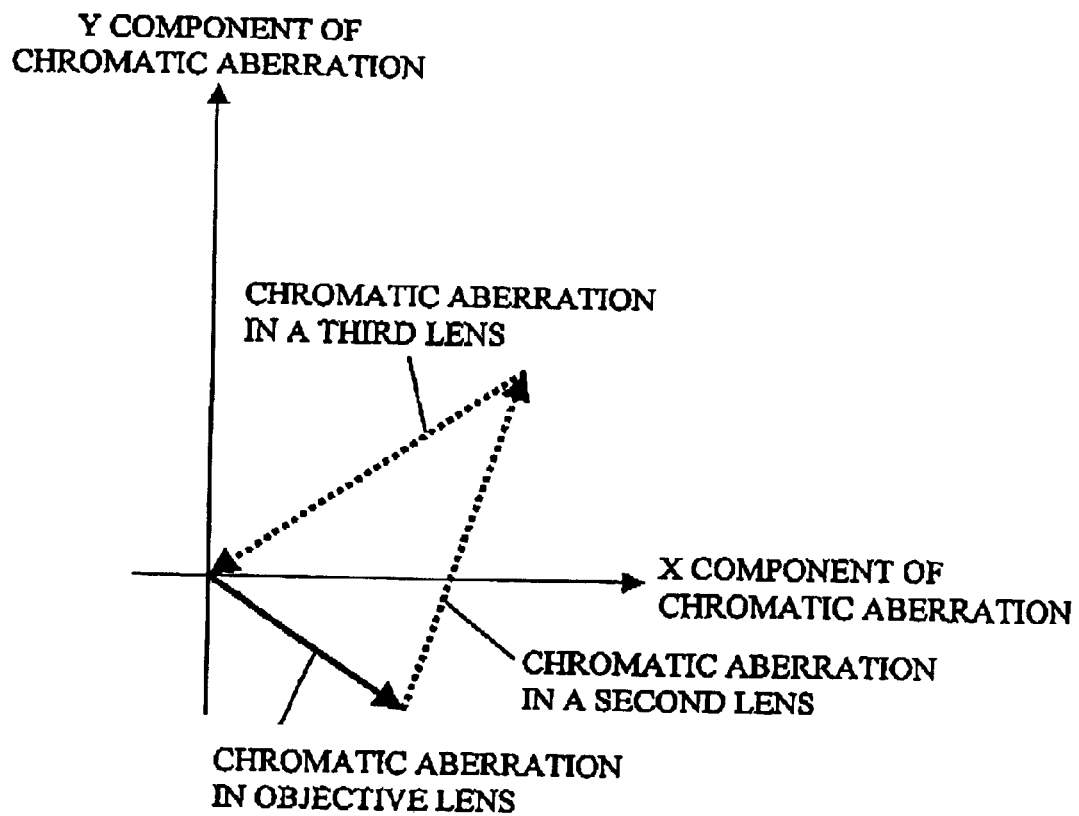
FIG. 8 shows the principle of correcting the chromatic aberration produced by the objective lens, through the effect of a plurality of lenses when the beam is inclined.

For example, the chromatic aberration produced by the objective lens upon inclination of the beam can be corrected using a plurality of lenses. Referring to FIG. 8, the chromatic aberration produced when the beam is inclined by the objective lens consists of X and Y components corresponding to the direction of the inclination of the beam. This aberration is produced not only in the objective lens but also in any focusing lens as long as the beam is inclined. Its magnitude, however, varies depending on the shape of the magnetic poles of the lens and/or the operating conditions (such as the focal length). Thus, in the case where the beam is inclined by a plurality of lenses, the chromatic aberration can be corrected if the (vector) sum of the chromatic aberration produced by each lens and the chromatic aberration produced by the objective lens is returned back to zero, as shown in FIG. 8. Accordingly, it does not matter how many lenses are used for correction; what is important is that the vector sum of the chromatic aberrations is zero. The same can be said for the coma aberration, whose direction and magnitude correspond to the inclination of the beam. Thus, the principle of correction of the chromatic aberration depicted in FIG. 8 can be similarly applied to the correction of the coma aberration.

Hereafter, other embodiments of the invention will be described by referring to FIGS. 10 to 18, which are directed to the control of trajectory in order to make the sum of aberrations produced by a plurality of lenses including an objective lens zero when the beam is inclined by the objective lens.

(Embodiment 5)

Figure 10:
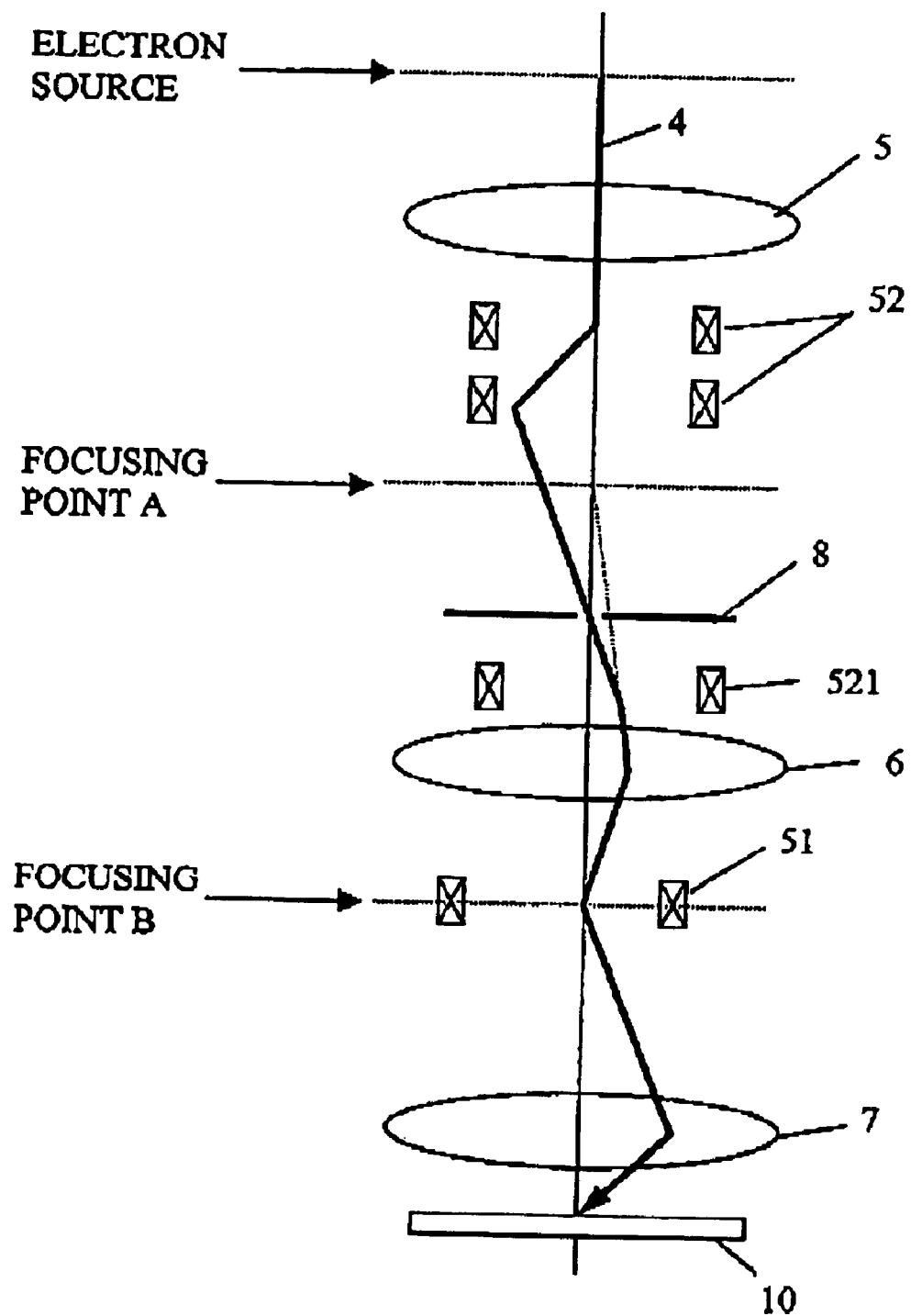
FIG. 10 shows an example of trajectory control for correcting an aberration in the objective lens.

FIG. 10 shows an example of trajectory control in a case where one deflector is disposed between the focusing lens 6 and the aperture 8. In this example, the aberration control coil 52 composed of deflectors disposed in two stages between the aperture 8 and the focusing lens 5 creates a condition such that the primary electron beam 4 passes through the center of the opening of the aperture 8 in an inclined manner. The trajectory of the electron beam is then controlled by a deflector 521 disposed between the aperture 8 and the focusing lens 6 such that the point of deflection of the primary electron beam 4 as seen from the focusing lens 6 is at a focus point A of the focusing lens 5. A focusing point B of the focusing lens 6 is coincident with the deflecting point of the beam inclination angle control coil 51, and the primary electron beam 4 is inclined by the operation of the beam inclination angle control coil 51 and the objective lens 7.

(Embodiment 6)

Figure 11:
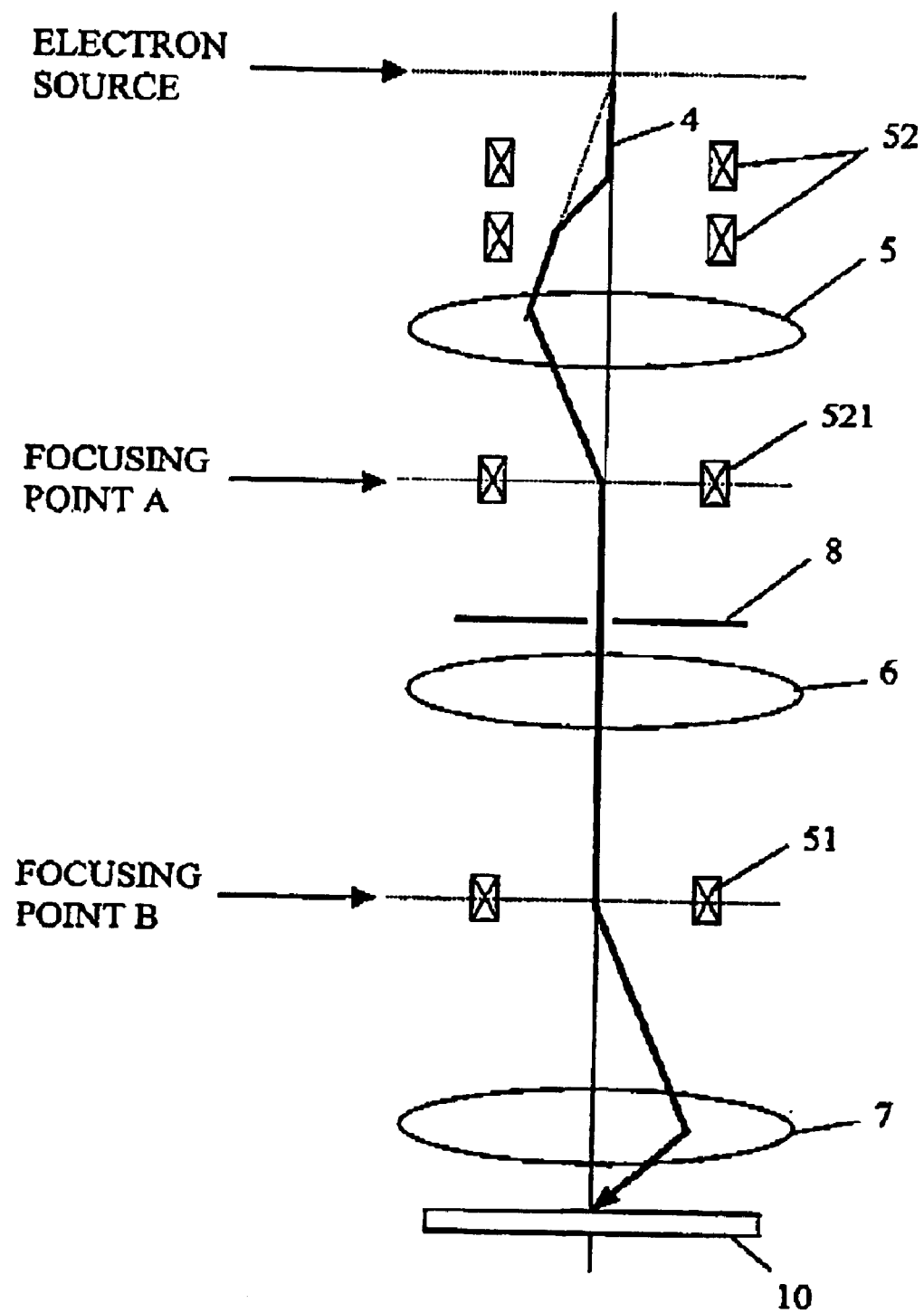
FIG. 11 shows an example of trajectory control for correcting an aberration in the objective lens.

FIG. 11 shows an example of trajectory control in a case where the deflectors cannot be disposed between the focusing lens 6 and the aperture 8. In this example, the trajectory of the primary electron beam 4 is controlled by an aberration control coil 52 composed of deflectors disposed in two stages between the focusing lens 5 and the electron source, such that the point of deflection of the primary electron beam 4 is apparently coincident with the position of the electron source. The direction of the aberration produced by the focusing lens 5 is reversed by the focusing lens 6. Accordingly, in order to cancel the aberration produced by the objective lens 7, the direction of displacement of the trajectory of the primary electron beam 4 as it passes through the focusing lens 5 (namely the direction of the aberration) is reversed with respect to that in the case of FIG. 10. Further, the position of a focusing point A of the focusing lens 5 is coincident with that of the deflector 521 (the point of deflection), so that the trajectory of the primary electron beam 4 is caused to be again coincident with the optical axis, using the focus point A as the point of deflection.

(Embodiment 7)

Figure 12:
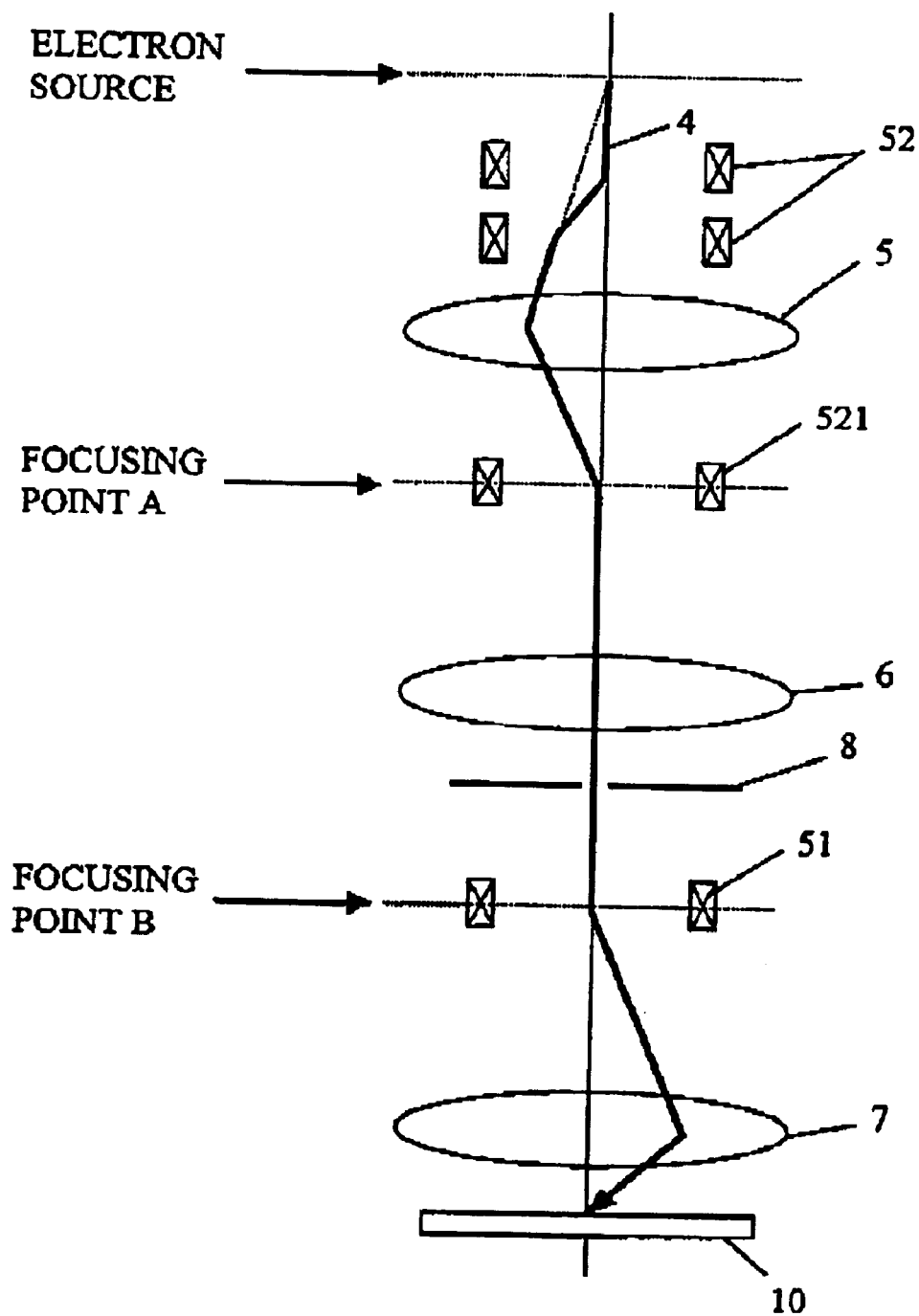
FIG. 12 shows an example of trajectory control for correcting an aberration in the objective lens.

FIG. 12 shows an example of trajectory control in a case where the aperture 8 is disposed between the focusing lens 6 and the objective lens 7. In this example, an aberration necessary for correcting the aberration produced by the objective lens when the primary electron beam 4 is inclined is produced by the focusing lens 5, as in the case of FIG. 11, for it is difficult to correct the aberration in the objective lens 7 using the focusing lens 6.

(Embodiment 8)

Figure 13:
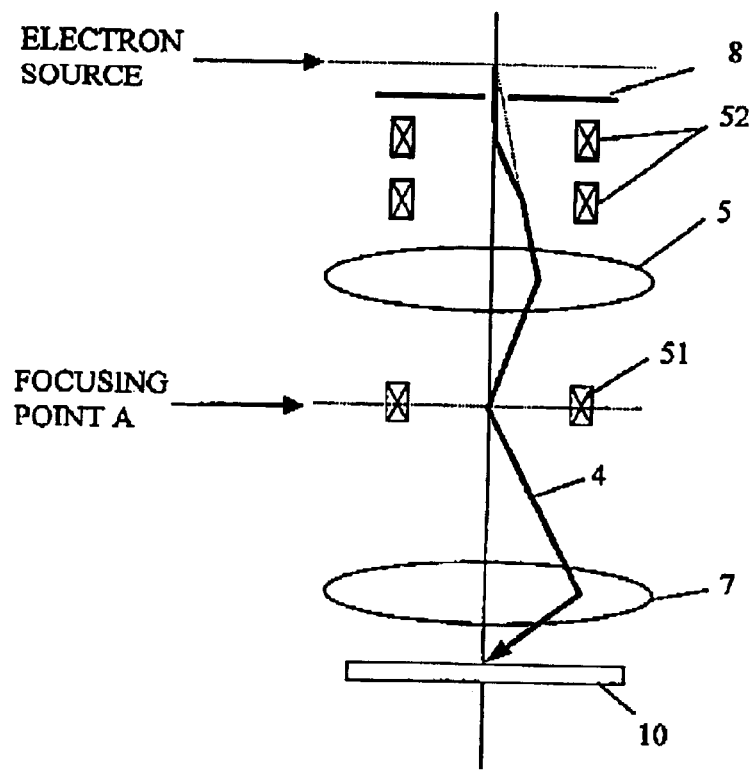
FIG. 13 shows an example of trajectory control in a case where the beam is inclined through the creation of a crossover (focusing point) of the beam between two stages of lenses.

FIG. 13 shows an example of trajectory control in a case where the beam is inclined while correcting for aberrations in an optical system in which the beam is once focused between lenses disposed in two stages. In this example, the aperture 8 is disposed between the focusing lens 5 and the electron source. The beam is deflected by the aberration control coil 52 composed of deflectors disposed in two stages between the aperture 8 and the focusing lens 5 such that the position of the electron source is apparently at the point of deflection. The beam inclination angle control coil 51 is disposed at the point of focus of the beam by the focusing lens 5, so that the angle of inclination of the beam on the sample 10 can be controlled by the beam inclination angle control coil 51.

(Embodiment 9)

Figure 14:
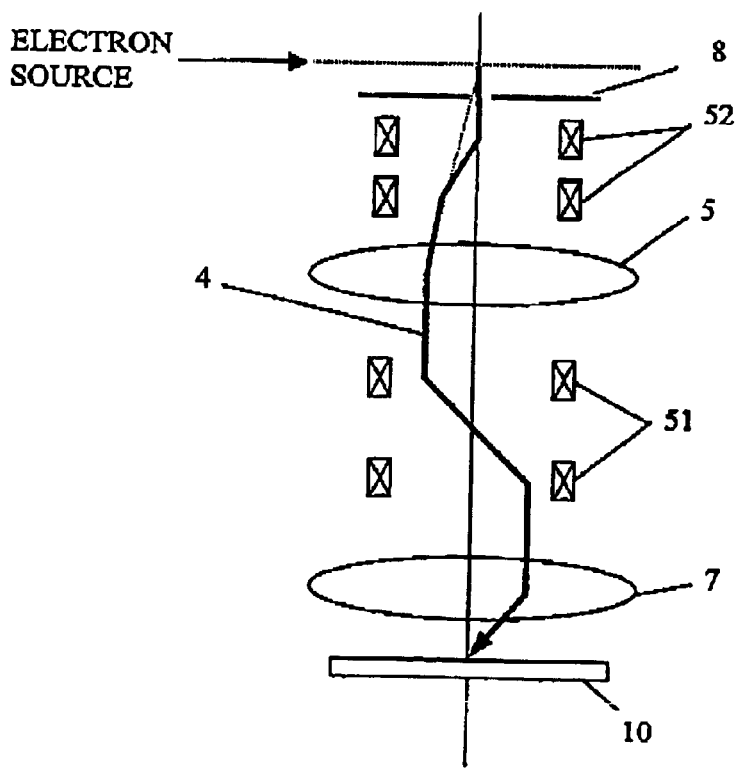
FIG. 14 shows an example of trajectory control in a case where the beam is inclined without creating a crossover (focusing point) of the beam between two stages of lenses.

FIG. 14 shows an example of trajectory control in a case where the beam is inclined while correcting for aberrations in an optical system in which the beam is not focused between lenses disposed in two stages. When the beam is not focused between the lenses, the direction of aberration produced by the focusing lens 5 is not reversed. Accordingly, the direction of deflection by the beam inclination angle control coil 51 is reversed with respect to that by the aberration control coil 52 so that the aberration by the focusing lens 5 and that by the objective lens 7 can cancel each other out.

(Embodiment 10)

Figure 15:
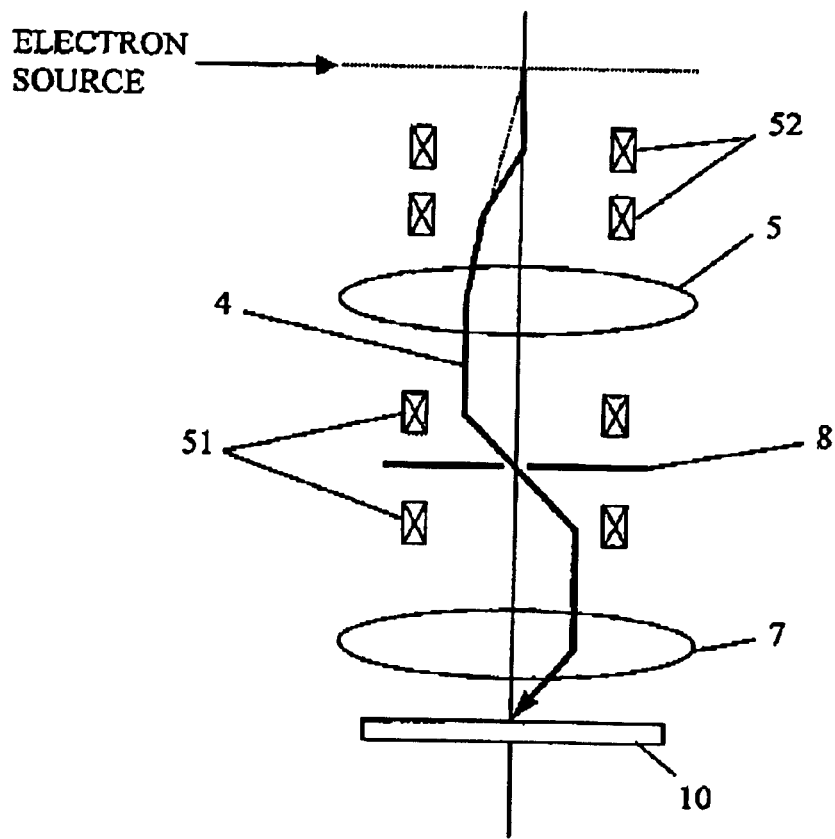
FIG. 15 shows an example of trajectory control in a case where the beam is inclined without creating a crossover (focusing point) of the beam between two stages of lenses where an aperture plate is disposed therebetween.

FIG. 15 shows an embodiment in which the aperture 8 is disposed between the focusing lens 5 and the objective lens 7, as opposed to the optical system of FIG. 14 (in which no crossover is crested along the optical axis). In this example, the beam inclination angle control coil 51 is disposed on either side of the aperture 8 and is operated in a manner such that the trajectory of the deflected primary electron beam 4 passes through the center of the opening of the aperture 8.

(Embodiment 11)

Figure 16:
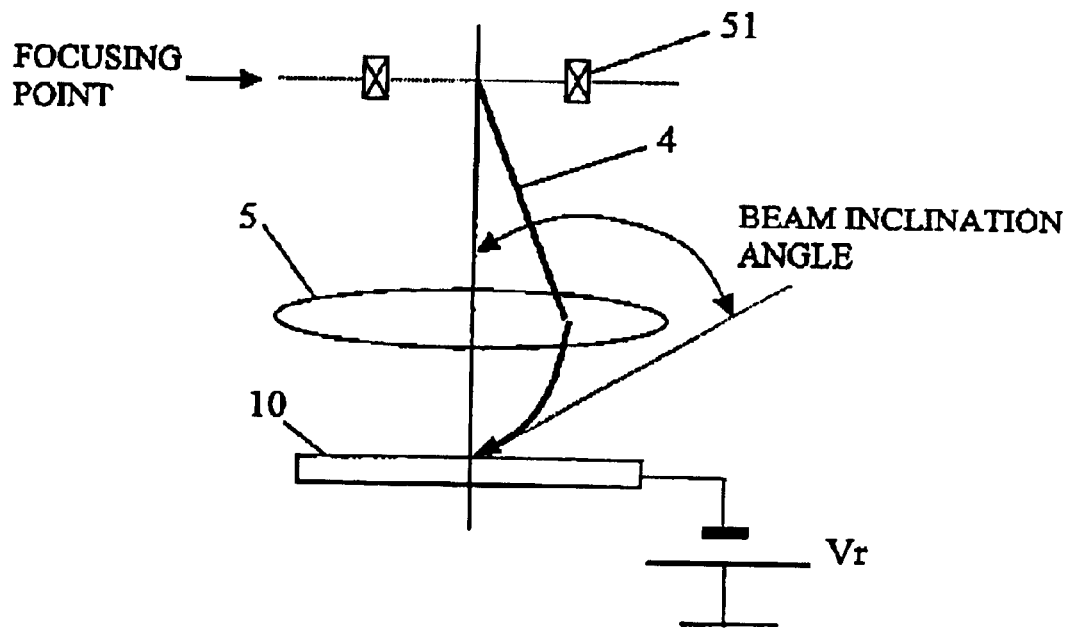
FIG. 16 shows an example of trajectory control in a case where a primary electron beam is inclined by the objective lens while applying a negative voltage to the sample.

FIG. 16 shows an example of trajectory control in a case where the primary electron beam 4 is inclined by the objective lens 7 while a negative voltage (Vr) is applied to the sample 10. As the negative voltage Vr is applied to the sample, the primary electron beam 4 rapidly decelerates immediately before reaching the sample 10. Thus, the angle of inclination of the beam on the sample can be increased as compared with a case where no negative voltage is applied.

(Embodiment 12)

Figure 17:
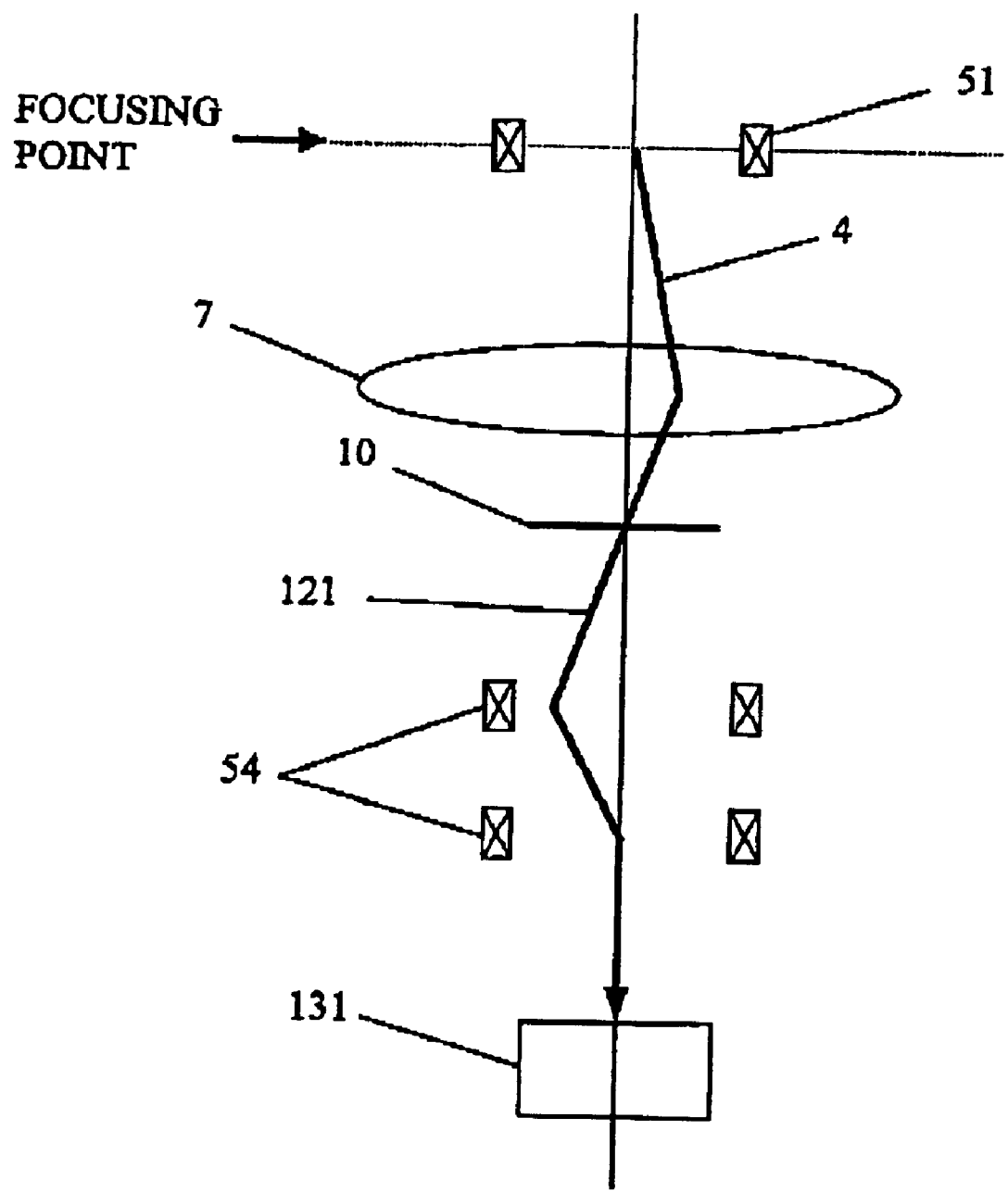
FIG. 17 shows an embodiment in which a thin film sample is irradiated with a beam inclined by an objective lens to obtain a scanning transmission electron (STEM) image.

FIG. 17 shows an embodiment in which a thin film sample 10 is irradiated with the primary electron beam 4 inclined by the objective lens 7, and in which electrons 121 that passed through the sample 10 are detected. When a scanning transmission image (STEM image) of a thin film sample having a crystal structure is to be obtained, it is often necessary to cause the irradiation orientation of the primary electron beam to correspond to the crystal orientation of the sample. As the crystal orientation of a sample varies depending on how the thin film slice is cut, crystal orientation errors of the order of several to ten degrees result. Therefore, the primary electron beam is arbitrarily inclined in the present embodiment while preventing the reduction in resolution. In this way, the electron beam can be aligned with the orientation of crystal more easily than by the method whereby the sample is mechanically inclined for orientation. A deflector 54 is disposed downstream of the thin film sample 10 for aligning the transmitted electrons 121 with respect to a transmitted electron detector 131. The deflector 54 is controlled in accordance with the angle of inclination of the primary electron beam 4. Preferably, a means such as a lens or an aperture (not shown) may be disposed between the thin film sample 10 and the transmitted electron detector 131 for limiting the angle of detection of the transmitted electrons.

(Embodiment 13)

Figure 18:
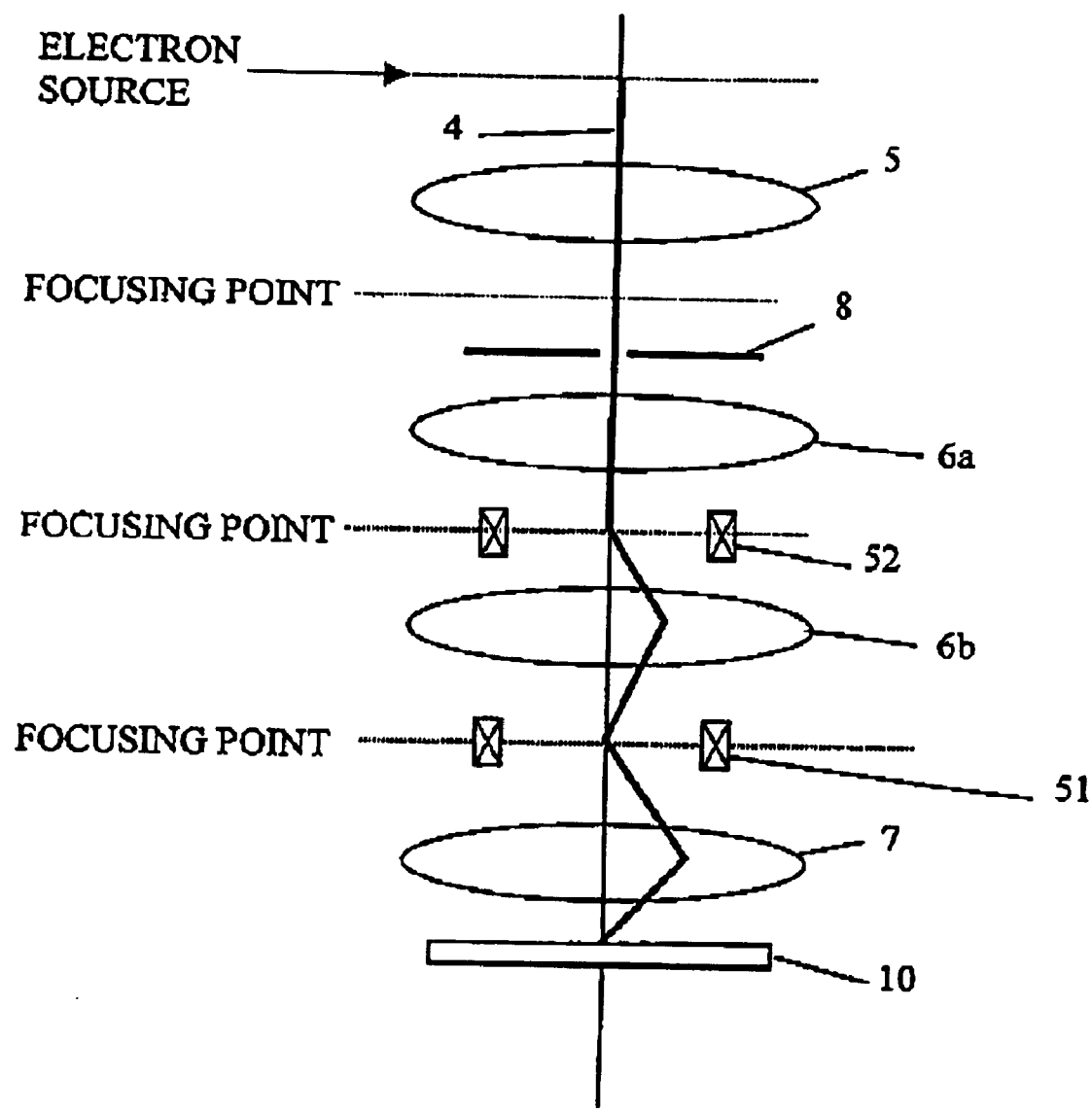
FIG. 18 shows an example of trajectory control in a case where two focusing lenses are disposed between an aperture and an objective lens.

FIG. 18 shows an example of trajectory control in the case where two focusing lenses 6a and 6b are disposed between the aperture 8 and the objective lens 7. In this example, a focusing point of the primary electron beam 4 is located between the focusing lenses 6a and 6b. An aberration control coil 52 is disposed at the focusing point so that an aberration is produced by the focusing lens 6b. A beam inclination angle control coil 51 is disposed at the point of focus of the primary electron beam by the focusing lens 6b, so that the primary electron beam 4 can be incident on the objective lens 7 off the axis thereof and be inclined with respect to the optical axis. The aberration control coil 52 is controlled such that the aberration produced by the objective lens 7 can be cancelled by the aberration in the focusing lens 6b.

(Embodiment 14)

Figure 19:
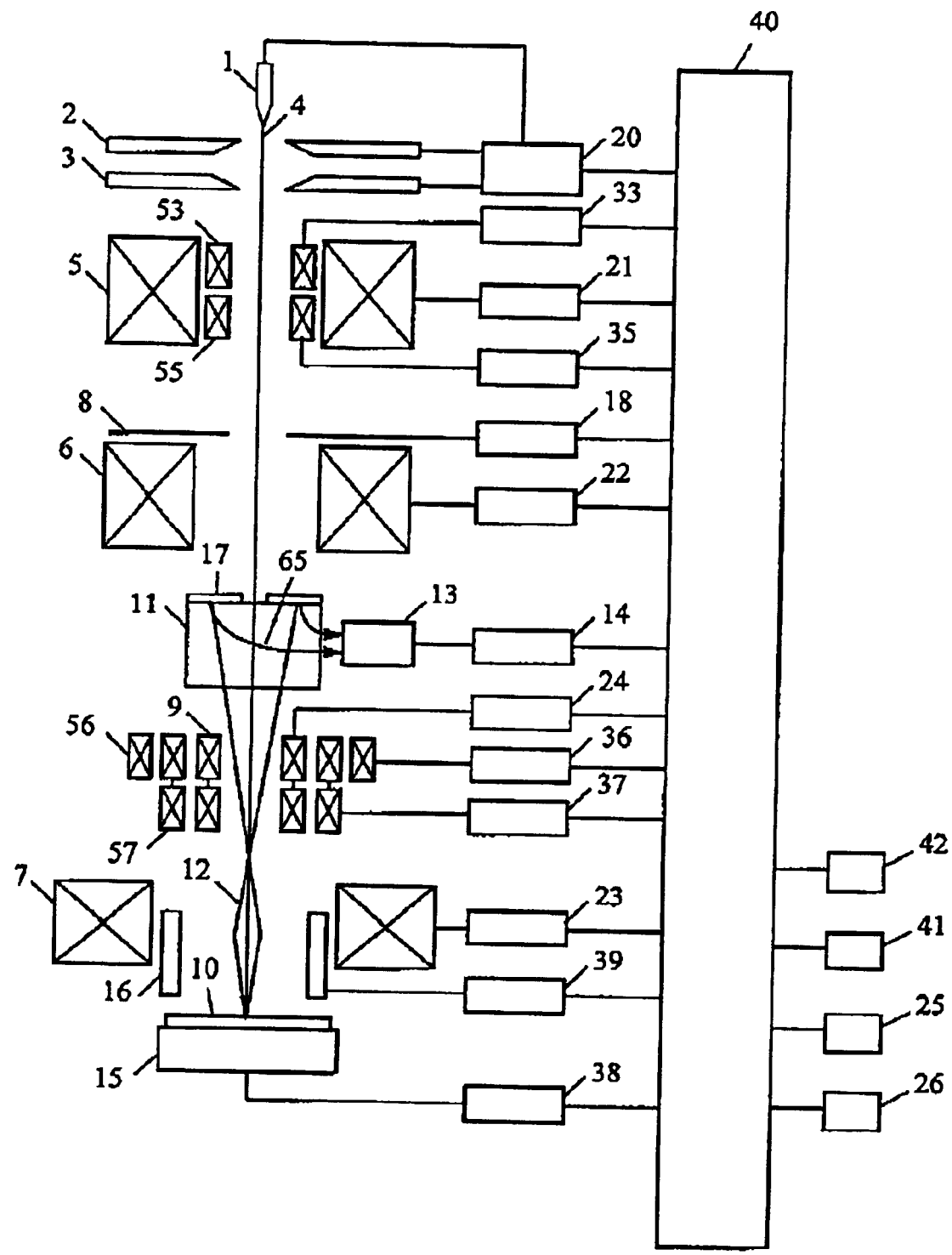
FIG. 19 shows the overall structure of a scanning electron microscope according to another embodiment of the invention.

FIGS. 19 to 25 show an embodiment in which an aperture transport mechanism is employed as the optical axis control means for controlling the incident position for a plurality of groups of lenses for focusing the charged particle beam. FIG. 19 shows in particular the overall structure of the scanning electron microscope for measuring the size of a pattern formed on a semiconductor wafer as well as observing the shape thereof. In the following, parts different from the structure depicted in FIG. 1 will be described.

An astigmatism correction coil 53 and an aligner coil 55 for correcting the irradiated position error produced by the operation of the astigmatism correction coil 53 are disposed at substantially the same height as a first focusing lens 5. The coils 53 and 55 are connected via power supplies 33 and 35, respectively, to a computer 40. An aperture plate 8 can be accurately transported by a drive mechanism 18 in a plane perpendicular to the optical axis. The drive mechanism 18 is connected to the computer 40. An image shift coil 57 and an alignment coil 56 are disposed in two stages at the same position as the scanning coil 9 and are connected via power supplies 37 and 36, respectively, to the computer 40.

Scanning electron microscopes for observing semiconductor wafers generally employ primary electron beams of low acceleration of the order of several hundred volts from the viewpoint of preventing damage to the sample. In order to realize high resolution at low acceleration, a retarding power supply 38 is connected to apply a negative voltage to the sample 10 so that the primary electron beam 4 can be decelerated. A boosting power supply 39 is connected to apply a positive high voltage to a boosting electrode 16 so that the primary electron beam can be accelerated in a later stage, thereby reducing the chromatic aberration in the objective lens 7 and achieving high resolution.

The retarding and boosting voltages create an electromagnetic field distribution near the surface of the sample 10 whereby the secondary electrons 12 are accelerated towards a reflecting plate (converting electrode) 17. As a result, the accelerated secondary electrons 12 pass through the scanning coil 9 and collide with the reflecting plate 17, whereby they are converted into new secondary electrons 65. The converted secondary electrons 65 are detected by a secondary signal detector 13.

Figure 20:
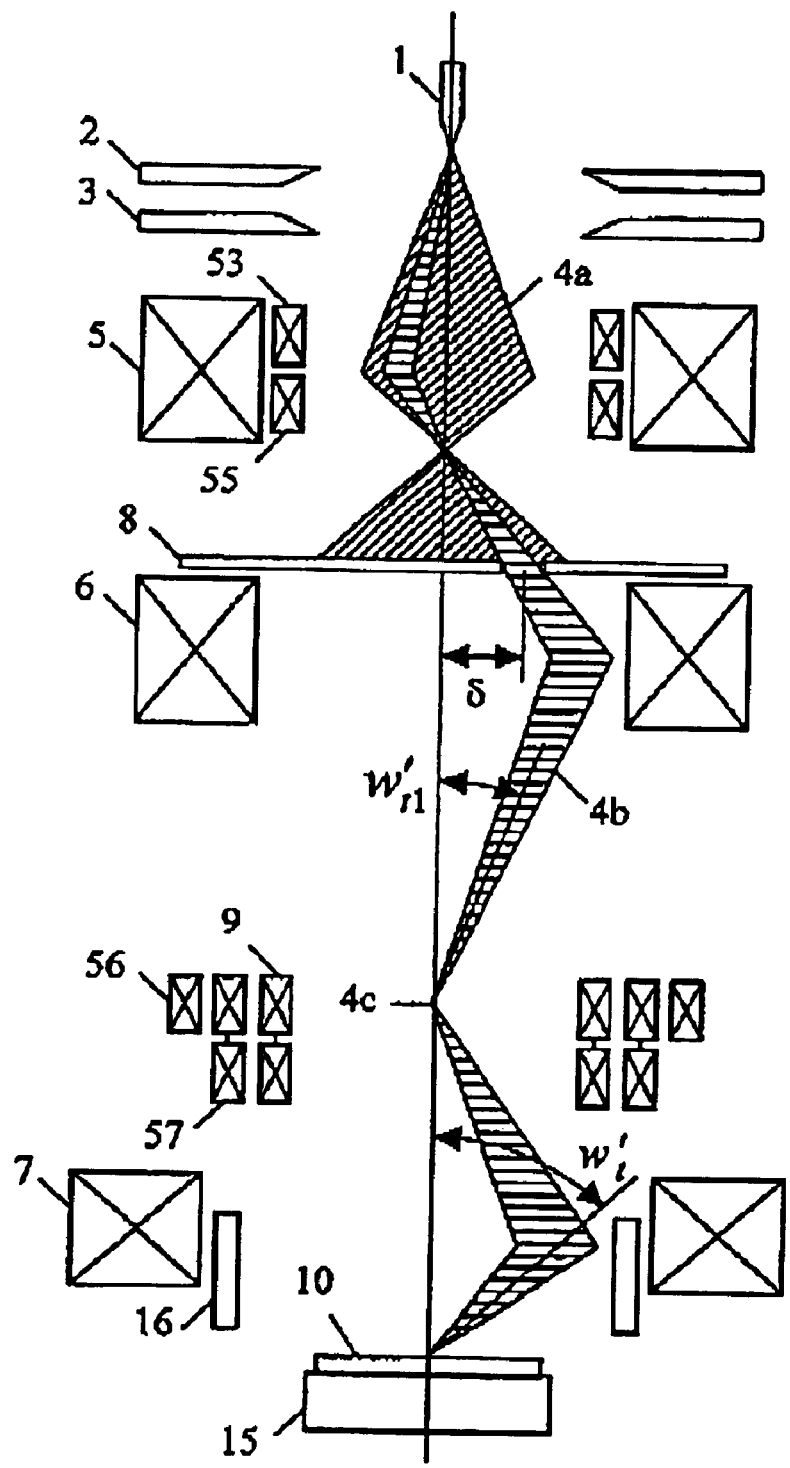
FIG. 20 illustrates the trajectory of a primary electron beam in detail.

FIG. 20 shows the trajectory of the primary electron beam 4 in the present embodiment. In this example, the position of a crossover 4c of the second focusing lens 6 is coincident with that of the aligner coil 56. Emitted electrons 4a drawn out of the cathode 1 have a sufficient spread as compared with the aperture size of the aperture plate 8. By shifting the aperture within the irradiated range of the emitted electrons 4a, a primary electron beam 4b off the optical axis can be selectively utilized. An inclination angle $w'_{t1}$ of the second focusing lens 6 and the amount $\delta$ of shift of the aperture are proportional to one another. Thus, an inclined image without an off-axis chromatic aberration can be obtained by controlling the beam inclination angle $w'_t$ with the aligner coil 56 such that equation (18) is satisfied.

The feature of the present system, namely the aperture transport mechanism, can be realized by simply modifying the manually operated aperture such that it is operated with a computer-controlled drive mechanism. Because the primary electron beam 4b travel off the optical axis in the interval between the cathode 1 and the crossover 4c of the second focusing lens 6, the aberration coefficient of the correction lens becomes several times as large as that of only the second focusing lens. Thus, off-axis chromatic aberrations with inclination angles up to large degrees can be corrected.

Figure 21:
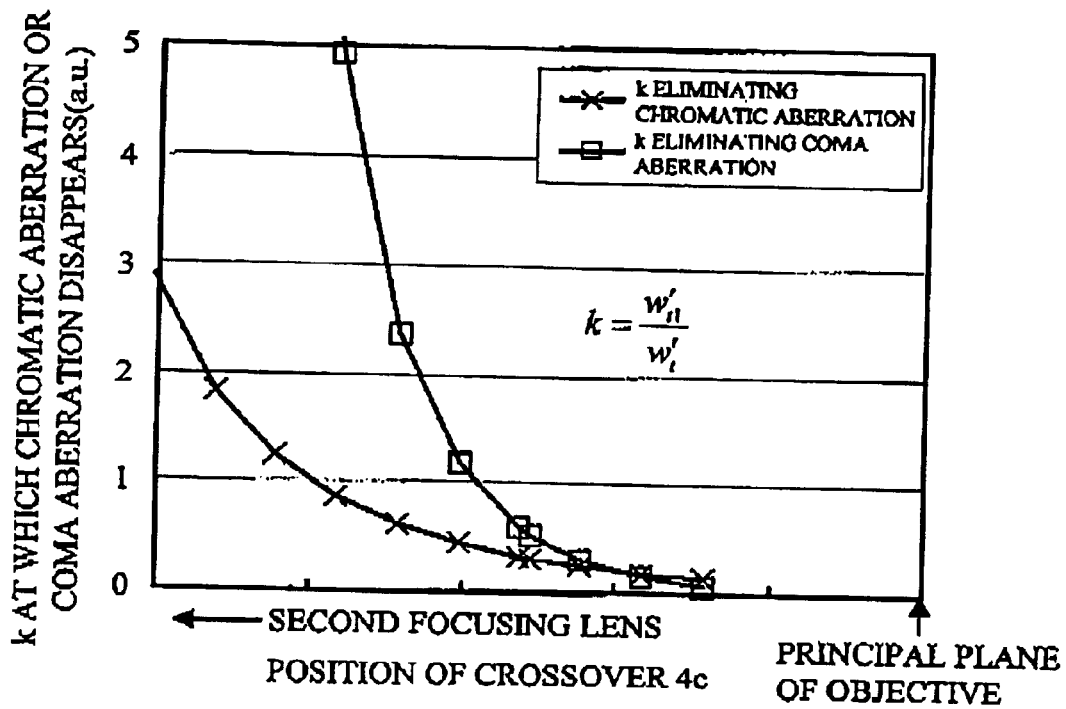
FIG. 21 shows changes in correction condition k when a crossover of a second focusing lens is changed.

FIG. 21 shows the changes in the correction condition k as the position of the crossover 4c is shifted from the second focusing lens 6 towards the objective lens 7. It is seen that, as the crossover 4c moves closer to the objective lens 7, k decreases until it reaches a point where the off-axis chromatic aberration and the coma aberration can be both corrected simultaneously so that equation (22) can be satisfied.

Figure 22:
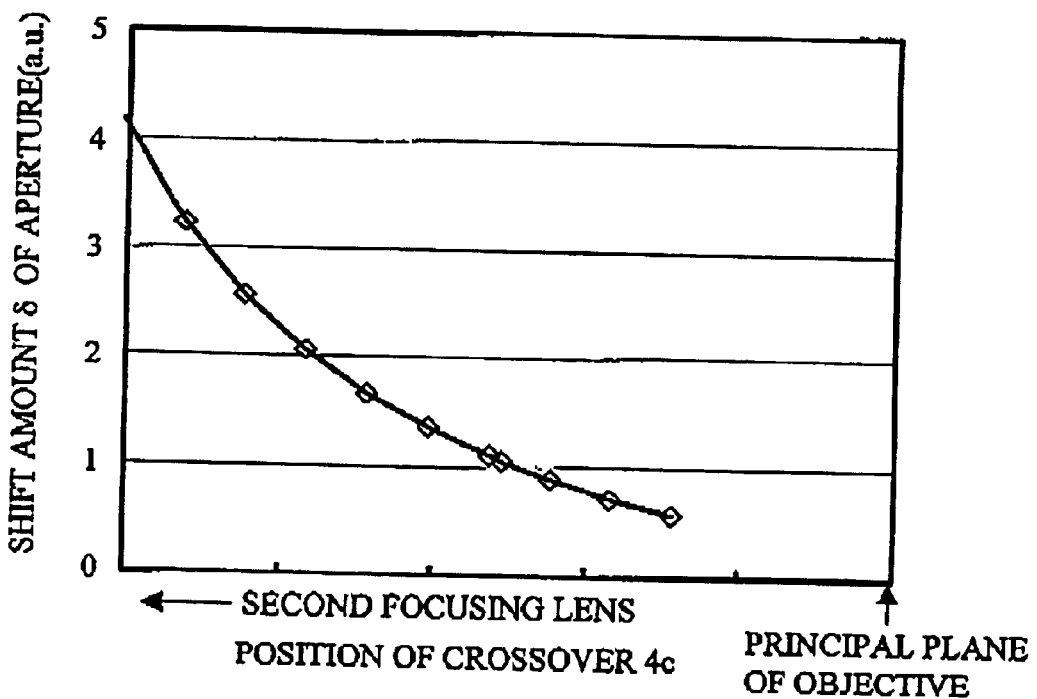
FIG. 22 shows changes in aperture shift amount δ when the crossover of the second focusing lens is changed.

FIG. 22 shows the changes in the shift amount 6 of the aperture 8 as the position of the crossover 4c is shifted from the second focusing lens 6 towards the objective lens 7 under the condition of equation (18) in which the off-axis chromatic aberration is corrected. It will be seen that, as the crossover 4c is brought closer to the objective lens 7, the shift amount δ decreases.

Figure 23:
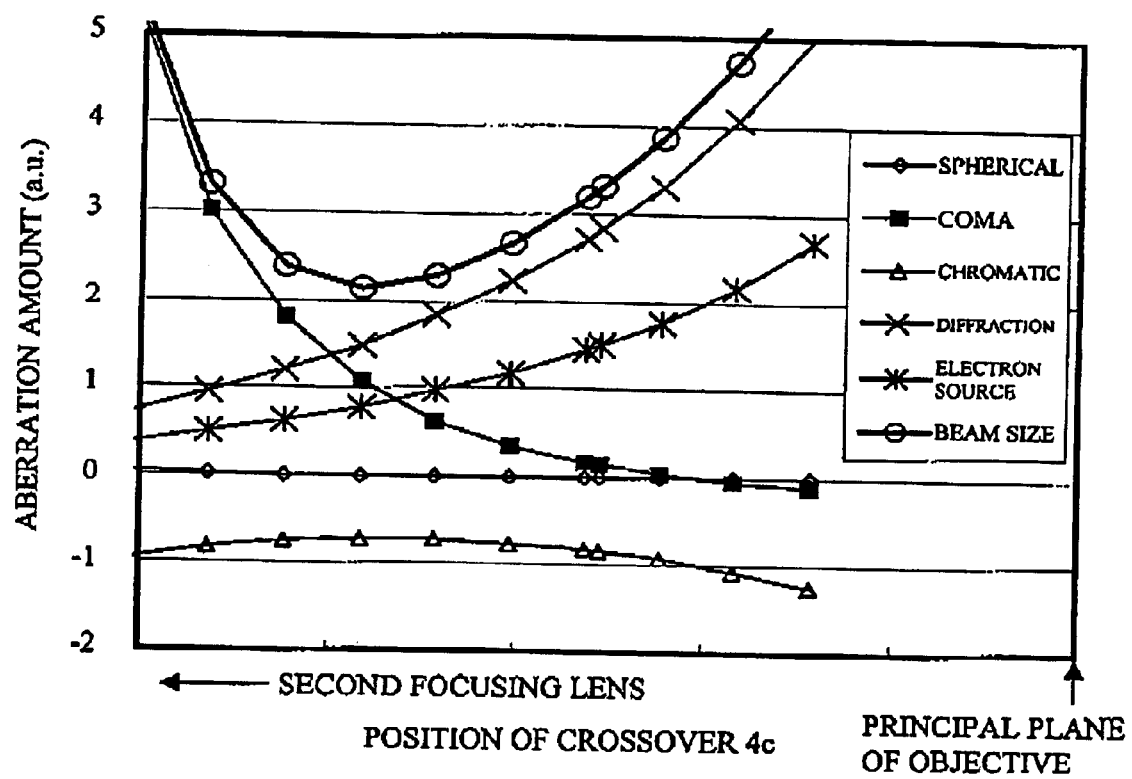
FIG. 23 shows changes in the amount of each aberration and the final beam size when a crossover of the second focusing lens is changed.

FIG. 23 shows the changes in the amount of each aberration and the final beam size (or resolution) as the position of the crossover 4c is shifted from the second focusing lens towards the objective lens under the condition of equation (18) in which the off-axis chromatic aberration is corrected. As the crossover 4c is moved towards the objective lens, the coma aberration decreases, but the diffraction aberration and the image of the electron source size (ratio of reduction of the electron source tip size by the lens) increase, whereby the optimum position of the crossover 4c is determined.

Figure 24:
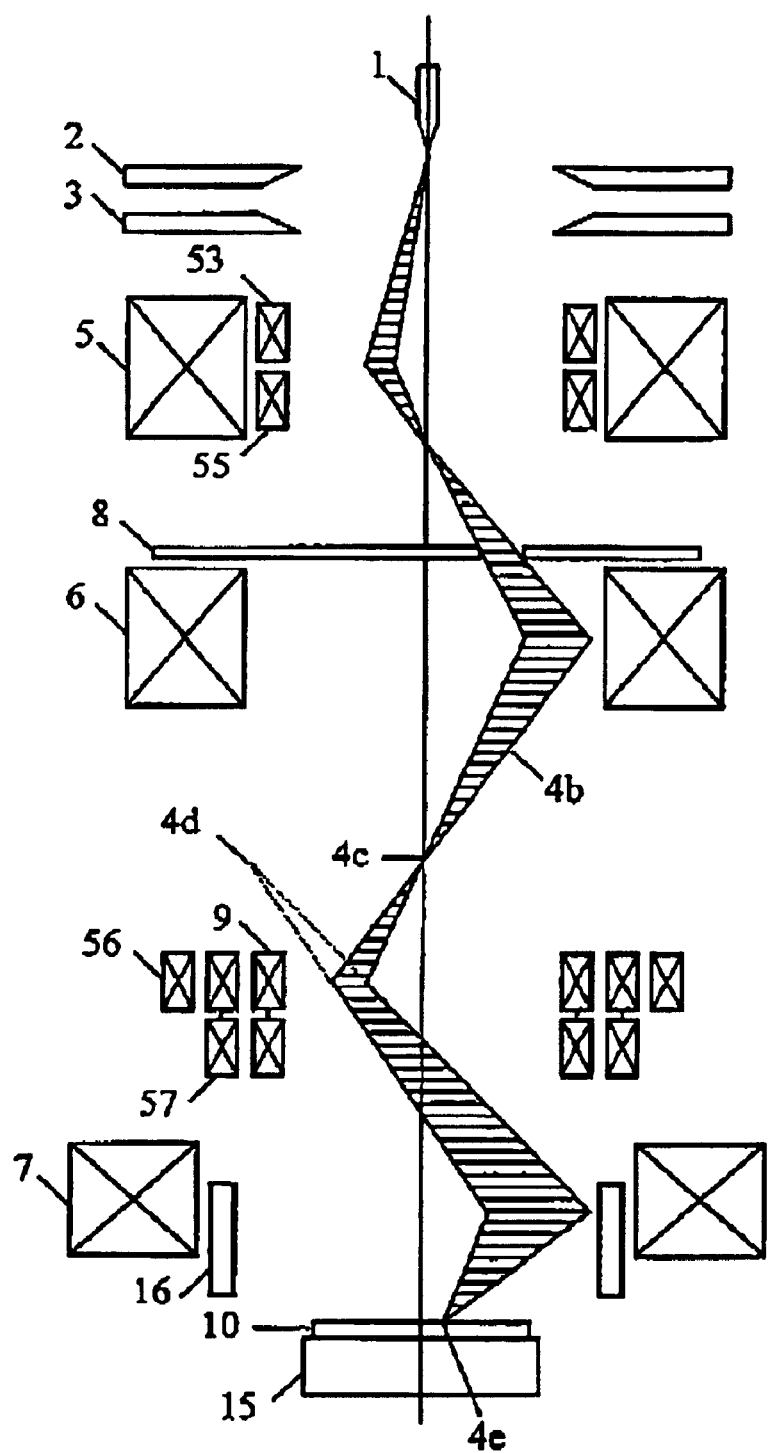
FIG. 24 shows an embodiment in which the position of the crossover is not coincident with the position of an aligner coil.

FIG. 24 shows an embodiment in which the position of the crossover 4c is not made coincident with that of the aligner coil 56, thereby giving priority to resolution. In this case, a virtual object point 4d as seen from the objective lens 7 does not coincide with the crossover 4c, resulting in a displacement of a point 4e of arrival of the beam on the sample 10 from the central axis. This shift, however, can be brought back to the central axis by controlling an image shift coil 57. Alternatively, a sample stage 15 may be moved to avoid the field of view error. In either case, the relationship concerning the beam inclination angle can be preset by registering it in the storage unit 41, for example, so that the position error can be controlled by the computer 40.

Figure 25:
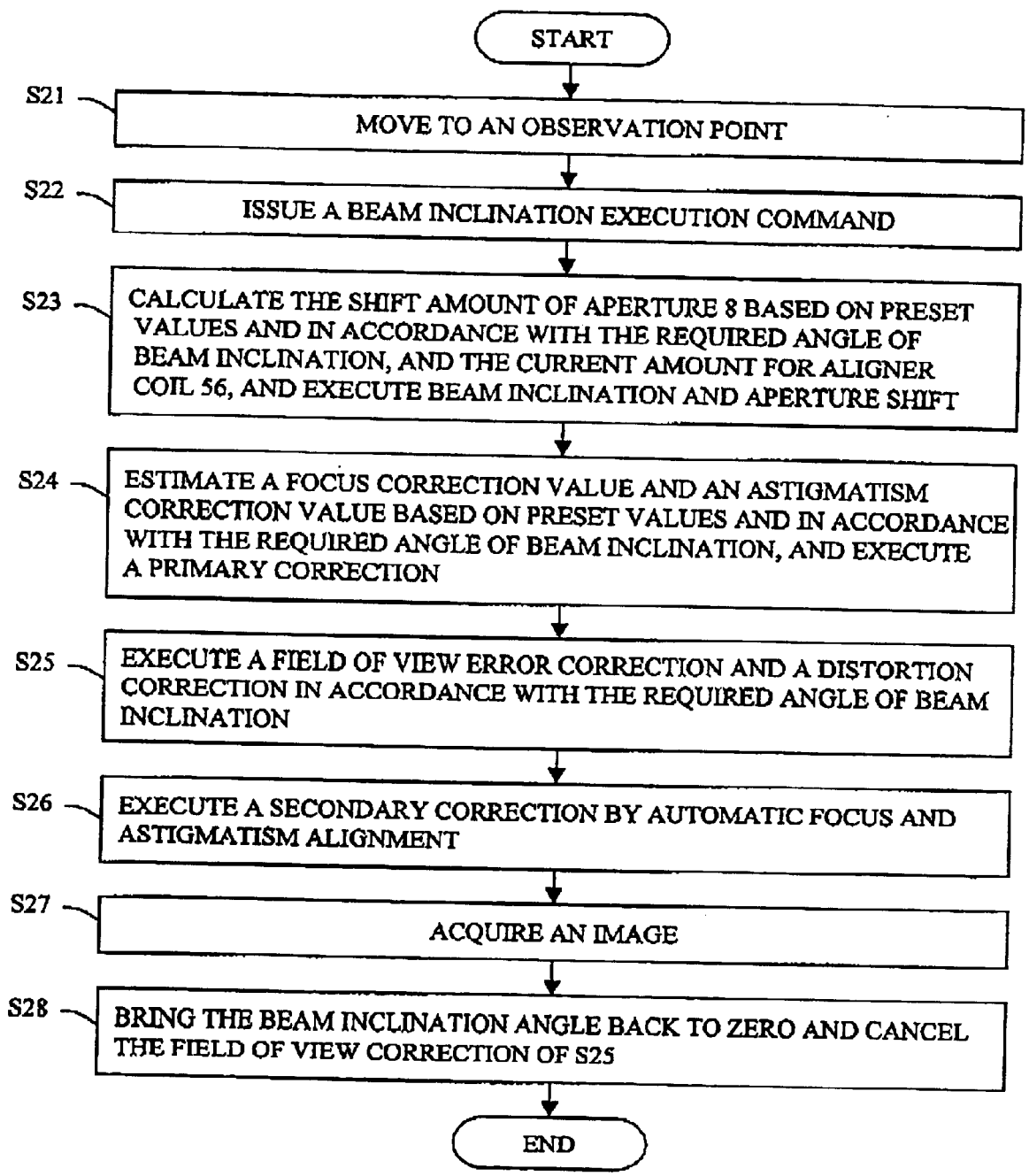
FIG. 25 shows a flowchart of the process of inclining the beam.

FIG. 25 shows a flowchart of the process of inclining the beam, including the step of correcting the field of view error. In S21, an observation point is reached. As a command for beam inclination is issued in S22, the shift amount of the aperture 8 and the amount of current to be supplied to the aligner coil 56 are calculated from preset values, in accordance with the required angle of beam inclination. The beam is then inclined and the aperture is shifted in S23. At the same time, a focus correction value and an astigmatism correction value are estimated from preset values in accordance with the required angle of beam inclination, and a primary correction is performed in S24. This is followed by a field of view error correction and a distortion correction in S25 in accordance with the required beam inclination angle. As the focus and astigmatism have been roughly corrected by the primary correction in step S24, a secondary correction can be completed in S26 within a narrower range of search than that for the normal automatic focus/astigmatism correction. Thus, an image with high resolution can be obtained in S27. After the image is obtained, the beam inclination angle is brought back to zero, and the field of view error correction in step S25 is cancelled in S28.

What is claimed is:

1. A charged particle beam apparatus comprising a charged particle source and a charged particle optical system for focusing a beam of charged particles emitted by said charged particle source and scanning a sample with the focused beam, said apparatus further comprising:

at least first and second deflectors for controlling the incident position of the charged particle beam on at least two focusing lenses including an objective lens, wherein the incident position of the charged particle beam on said objective lens is controlled by said first deflector in order to irradiate said sample with said charged particle beam from a direction that is inclined with respect to the optical axis of said objective lens, and wherein the incident position of the charged particle beam on at least one of said focusing lenses other than said objective lens is controlled by said second deflector such that an off-axis chromatic aberration is produced that cancels an off-axis chromatic aberration produced by the objective lens when the incident position of said charged particle beam on said objective lens is controlled.

2. A charged particle beam apparatus comprising a charged particle source and a charged particle optical system for focusing a beam of charged particles emitted by said charged particle source and scanning sample with the focused beam, said apparatus further comprising:

at least first and second deflectors for controlling the incident position of the charged particle beam on at least two focusing lenses including an objective lens, wherein the incident position of the charged particle beam on said objective lens is controlled by said first deflector in order to irradiate said sample with said charged particle beam from a direction that is inclined with respect to the optical axis of said objective lens, and wherein the incident position of the charged particle beam on at least one of said focusing lenses other than said objective lens is controlled by said second deflector such that a coma aberration is produced that cancels a coma aberration produced by the objective lens when the incident position of said charged particle beam on said objective lens is controlled.

3. A charged particle beam apparatus comprising a charged particle source and a charged particle optical system for focusing a beam of charged particles emitted by said charged particle source and scanning a sample with the focused beam, said apparatus further comprising:

at least first and second deflectors for controlling the incident position of the charged particle beam on at least two focusing lenses including an objective lens; and a lens control device for controlling said focusing lenses independently, and wherein the focusing lenses are controlled by the lens control device; and the incident position of the charged particle beam on said objective lens is controlled by said first deflector in order to irradiate said sample with said charged particle beam from a direction that is inclined with respect to the optical axis of said objective lens, and the incident position of the charged particle beam on at least one of said focusing lenses other than said objective lens is controlled by said second deflector such that an off-axis chromatic aberration and a coma aberration are produced that cancel an off-axis chromatic aberration and a coma aberration produced by the objective lens when the incident position of said charged particle beam on said objective lens is controlled.

4. The charged particle beam apparatus according to claim 1, wherein the charged particle beam is shone on the sample under observation at an angle with respect to the optical axis.

5. The charged particle beam apparatus according to claim 4, further comprising an astigmatism correction device which is controlled in accordance with the inclination angle of the charged particle beam.

6. The charged particle beam apparatus according to claim 4, wherein the focal length of the objective lens is controlled in accordance with the inclination angle of the charged particle beam.

7. The charged particle beam apparatus according o claim 4, wherein an irradiated position error of the charged particle beam on th sample is corrected in accordance with the inclination angle of the charged particle beam.

8. The charged particle beam apparatus according to claim 1, wherein the at least one of the focusing lenses other than the objective lens include a first lens and a second lens, the first lens having magnetic poles with a relatively large opening diameter and gap and the second lens having magnetic poles with a relatively small opening diameter and gap, and wherein the first lens is excited when the charged particle beam is shone on the sample under observation parallel to the optical axis while turning off the second lens, and the second lens is excited when the charged particle beam is shone on the sample at an angle with respect to the optical axis while turning off the first lens.

9. The charged particle beam apparatus according to claim 1, further comprising an aperture and a transport mechanism for moving the aperture in a plane perpendicular to the optical axis.

10. A changed particle beam apparatus according to claim 1, wherein a deflector is disposed between the charged particle beam source and said focusing lenses.

11. The charged particle beam apparatus according to claim 10, wherein the charged particle beam is shone on the sample under observation at an angle with respect to the optical axis.

12. A charged particle beam apparatus comprising a charged particle source and a charged particle optical system for focusing a beam of charged particles emitted by said charged particle source and scanning a sample with the focused beam, said apparatus further comprising:

an aperture mechanism transportable in a direction perpendicular to the optical axis, said aperture mechanism disposed between the charged particle beam source and at least two stages of focusing lenses including an objective lens, wherein the aperture mechanism limits the passage of the charged particle beam such that the aberration produced by the objective lens and that produced by the other lenses cancel each other out.

13. The charged particle beam apparatus according to claim 12, wherein the charged particle beam is shone on the sample under observation at an angle with respect to the optical axis.

14. A method of irradiating a sample with a charged particle beam at an angle with respect to the optical axis, using a charged particle beam apparatus comprising a charged particle beam source and at least two stages of focusing lenses including an objective lens for focusing a beam of charged particles emitted by the charged particle beam source and scanning the sample with the charged particle beam, wherein the charged particle beam is incident on one of the at least two stages of focusing lenses which is closer to the charged particle beam source from a direction such that an aberration is produced that offsets the aberration produced by the inclination of the charged particle beam.

* * * * *